US008296715B2

(12) United States Patent
Tsubamoto

(10) Patent No.: US 8,296,715 B2
(45) Date of Patent: *Oct. 23, 2012

(54) WIRING DESIGN ASSISTING APPARATUS, WIRING DESIGN ASSISTING METHOD, AND COMPUTER-READABLE INFORMATION RECORDING MEDIUM

(75) Inventor: Daita Tsubamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 288 days.

This patent is subject to a terminal disclaimer.

(21) Appl. No.: 12/823,222

(22) Filed: Jun. 25, 2010

(65) Prior Publication Data

US 2011/0023005 A1    Jan. 27, 2011

(30) Foreign Application Priority Data

Jul. 22, 2009 (JP) ................................ 2009-171564

(51) Int. Cl.
*G06F 17/50* (2006.01)
(52) U.S. Cl. ......... 716/137; 716/115; 716/126; 716/132
(58) Field of Classification Search ........................ None
See application file for complete search history.

(56) References Cited

U.S. PATENT DOCUMENTS

| | | | | |
|---|---|---|---|---|
| 5,502,644 A | * | 3/1996 | Hamilton et al. | 716/115 |
| 5,751,597 A | * | 5/1998 | Okano et al. | 716/115 |
| 6,058,256 A | * | 5/2000 | Mellen et al. | 716/115 |
| 6,418,401 B1 | * | 7/2002 | Dansky et al. | 703/27 |
| 6,480,996 B1 | * | 11/2002 | Aji et al. | 716/129 |
| 6,769,102 B2 | * | 7/2004 | Frank et al. | 716/112 |
| 6,922,822 B2 | * | 7/2005 | Frank et al. | 716/112 |
| 7,168,058 B2 | * | 1/2007 | Harada et al. | 716/112 |
| 7,805,689 B2 | * | 9/2010 | Ueda et al. | 716/118 |
| 8,060,852 B1 | * | 11/2011 | Varma et al. | 716/136 |
| 8,136,074 B2 | * | 3/2012 | Sadamatsu | 716/120 |

FOREIGN PATENT DOCUMENTS

| | | |
|---|---|---|
| JP | 09-036504 | 2/1997 |
| JP | 11-317572 | 11/1999 |

* cited by examiner

*Primary Examiner* — Leigh Garbowski
(74) *Attorney, Agent, or Firm* — Squire Sanders (US) LLP

(57) ABSTRACT

A wiring design assisting apparatus includes an input part that has attribute information of a wiring pattern input thereto; a degradation degree process part that obtains a degradation degree in signal characteristics of a wiring pattern corresponding to attribute information that is input to the input part, based on position information of the wiring pattern corresponding to the attribute information input to the input part, position information and size information of a pattern removed area, and the degradation degree information; and an extracting process part that extracts, for re-wiring, wiring patterns that have degradation degrees equal to or more than a predetermined degree, from wiring patterns for which degradation degrees have been obtained by the degradation degree process part.

11 Claims, 26 Drawing Sheets

FIG.3A
FIG.3B
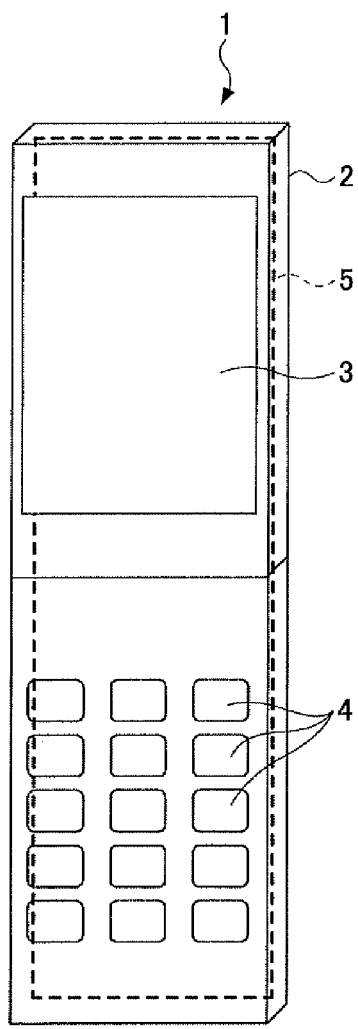
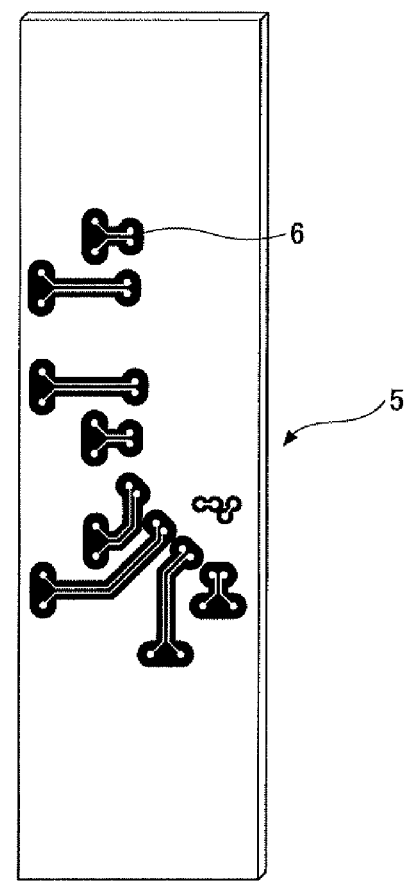

FIG.5A

| No. | LAYER | SIGNAL NAME | DATA RATE | ELECTRIC CONDUCTIVITY (S/m) | DIELECTRIC CONSTANT | WIRING WIDTH (mm) | WIRING THICKNESS (mm) | INTERLAYER DISTANCE (mm) | INTERLAYER WIRING HEIGHT (mm) | START-POINT COORDINATE (mm) | | END-POINT COORDINATE (mm) | |
|---|---|---|---|---|---|---|---|---|---|---|---|---|---|
| | | | | | | | | | | X | Y | X | Y |
| 1 | 1 | data001 | 1e** | 5×10³ | 3.8 | 0.1 | 0.035 | 0.255 | 0.1 | 10 | 20 | 50 | 20 |
| 2 | 1 | data001 | 1e** | 5×10³ | 3.8 | 0.1 | 0.035 | 0.255 | 0.1 | 50 | 20 | 50 | 40 |
| 3 | 1 | data001 | 1e** | 5×10³ | 3.8 | 0.1 | 0.035 | 0.255 | 0.1 | 50 | 40 | 80 | 40 |
| 4 | 3 | data001 | 1e** | 5×10³ | 3.8 | 0.1 | 0.035 | 0.255 | 0.1 | 10 | 20 | 50 | 20 |
| 5 | 3 | data001 | 1e** | 5×10³ | 3.8 | 0.1 | 0.035 | 0.255 | 0.1 | 50 | 20 | 50 | 40 |
| 6 | 3 | data001 | 1e** | 5×10³ | 3.8 | 0.1 | 0.035 | 0.255 | 0.1 | 50 | 40 | 80 | 40 |
| ... | ... | ... | ... | ... | ... | ... | ... | ... | ... | ... | ... | ... | ... |
| n | 5 | data*** | 1e** | 5×10³ | 3.8 | – | 0.035 | 0.255 | 0.1 | – | – | – | – |

FIG.5B

| No. | LAYER | DIAMETER (mm) | CENTER COORDINATE (mm) | |
|---|---|---|---|---|
| | | | X | Y |
| 1 | 4 | 3.0 | 30 | 22.5 |
| 2 | 4 | 3.0 | 70 | 37.5 |
| ⋮ | ⋮ | ⋮ | ⋮ | ⋮ |
| n | – | 3.0 | – | – |

FIG.7

| RANK | No. | LAYER | SHIFT OF CHARACTERISTIC IMPEDANCE (Ω) |
|---|---|---|---|
| 1 | 4 | 3 | 8 |
| 2 | 6 | 3 | 5 |
| 3 | 5 | 3 | 2 |
| 4 | 2 | 1 | 1 |
| 5 | 3 | 1 | 1 |
|  |  |  |  |

FIG.8

| RANK | LAYER | TOTAL AMOUNT OF SHIFTS OF CHARACTERISTIC IMPEDANCE (Ω) |
|---|---|---|
| 1 | 3 | 17 |
| 2 | 5 | 10 |
| 3 | 1 | 8 |

FIG.9

| RANK | No. | LAYER | SHIFT OF CHARACTERISTIC IMPEDANCE (Ω) |
|---|---|---|---|
| 1 | 4 | 3 | 8 |
| 2 | 6 | 3 | 5 |
| 3 | 5 | 3 | 2 |

FIG.10

| No. | CURRENT LAYER | LAYER TO WHICH WIRING PATTERN IS ALLOCATED |
|---|---|---|
| 4 | 3 | 1 |

FIG.11

| No. | LAYER | ONE SIDE | BOTH SIDES | IMMEDIATELY ABOVE/ IMMEDIATELY BELOW | SAME LAYER/ ONE LAYER ABOVE/ ONE LAYER BELOW | DETERMINATION |
|---|---|---|---|---|---|---|
| - | - | 1 | 0 | 0 | 1 | SOLID PATTERN REMOVED AREA EXISTS ON ONE SIDE |
| - | - | 1 | 0 | 0 | 0 | NO SOLID PATTERN REMOVED AREA EXISTS |
| - | - | 0 | 0 | 1 | 1 | SOLID PATTERN REMOVED AREA EXISTS IMMEDIATELY ABOVE/IMMEDIATELY BELOW |
| - | - | 1 | 0 | 0 | 1 | SOLID PATTERN REMOVED AREA EXISTS ON ONE SIDE |
| - | - | 1 | 0 | 0 | 0 | NO SOLID PATTERN REMOVED AREA EXISTS |
| - | - | 0 | 1 | 0 | 1 | SOLID PATTERN REMOVED AREAS EXIST ON BOTH SIDES |
| - | - | 0 | 0 | 1 | 1 | SOLID PATTERN REMOVED AREA EXISTS IMMEDIATELY ABOVE/IMMEDIATELY BELOW |

(IN CASE WHERE DIVIDING UNIT IS 0.5mm)

FIG.15

| X COORDINATE (mm) | Y COORDINATE (mm) | WHETHER SOLID PATTERN REMOVED AREA EXISTS |
|---|---|---|
| 28.5 | 20.5 | 0 |
| 28.5 | 21.0 | 1 |
| 28.5 | 21.5 | 1 |
| 29.0 | 20.5 | 0 |
| 29.0 | 21.0 | 1 |
| 29.0 | 21.5 | 1 |
| 29.5 | 20.5 | 0 |
| 29.5 | 21.0 | 1 |
| 29.5 | 21.5 | 1 |
| 30.0 | 20.5 | 0 |
| 30.0 | 21.0 | 1 |
| 30.0 | 21.5 | 1 |
| 30.5 | 20.5 | 0 |
| 30.5 | 21.0 | 1 |
| 30.5 | 21.5 | 1 |
| 31.0 | 20.5 | 0 |
| 31.0 | 21.0 | 0 |
| 31.0 | 21.5 | 1 |

FIG.24

| DIELECTRIC CONSTANT | DISTANCE BETWEEN WIRING PATTERNS IN THICKNESS DIRECTION (mm) | NOISE PER UNIT AREA (mV) |
|---|---|---|
| 3.5 | 0.5 | 20 |
| | 1.0 | 15 |
| | 1.5 | 10 |
| 4.0 | 0.5 | 25 |
| | 1.0 | 20 |
| | 1.5 | 15 |
| 4.5 | 0.5 | 30 |
| | 1.0 | 25 |
| | 1.5 | 20 |

FIG.25

| DISTANCE BETWEEN WIRING PATTERNS (mm) | SOLID OFFSET (mm) | CORRECTION COEFFICIENT |
|---|---|---|
| 0 | 0 | 1 |
| 0 | 0.1 | 0.9 |
| 0 | 0.2 | 0.8 |
| 0.1 | 0 | 0.9 |
| 0.1 | 0.1 | 0.8 |
| 0.1 | 0.2 | 0.7 |
| 0.2 | 0 | 0.8 |
| 0.2 | 0.1 | 0.7 |
| 0.2 | 0.2 | 0.6 |

FIG.27

| X COORDINATE (mm) | Y COORDINATE (mm) | WHETHER SOLID PATTERN REMOVED AREA EXISTS | DISTANCE BETWEEN WIRING PATTERNS (mm) |
|---|---|---|---|
| 28.5 | 20.5 | 0 | – |
| 28.5 | 21.0 | 0 | – |
| 28.5 | 21.5 | 0 | – |
| 29.0 | 20.5 | 0 | – |
| 29.0 | 21.0 | 1 | 1.0 |
| 29.0 | 21.5 | 0 | – |
| 29.5 | 20.5 | 0 | – |
| 29.5 | 21.0 | 1 | 1.0 |
| 29.5 | 21.5 | 0 | – |
| 30.0 | 20.5 | 0 | – |
| 30.0 | 21.0 | 1 | 1.0 |
| 30.0 | 21.5 | 0 | – |
| 30.5 | 20.5 | 0 | – |
| 30.5 | 21.0 | 1 | 1.0 |
| 30.5 | 21.5 | 0 | – |
| 31.0 | 20.5 | 0 | – |
| 31.0 | 21.0 | 0 | – |
| 31.0 | 21.5 | 0 | – |

…

WIRING DESIGN ASSISTING APPARATUS, WIRING DESIGN ASSISTING METHOD, AND COMPUTER-READABLE INFORMATION RECORDING MEDIUM

CROSS-REFERENCE TO RELATED APPLICATIONS

This application is based upon and claims the benefit of priority of the prior Japanese Patent Application No. 2009-171564, filed on Jul. 22, 2009, the entire contents of which are incorporated herein by reference.

FIELD

The embodiments discussed herein are directed to a wiring design assisting apparatus, a wiring design assisting method and a computer-readable information recording medium.

BACKGROUND

For a printed circuit board for an electronic apparatus, high-density mounting has advanced in which the number of electronic devices to be mounted increases, a printed circuit board is miniaturized, and so forth.

As the high-density mounting has thus advanced, paths of electric currents have become complicated, and thus, issues of impedance mismatching or crosstalk in wiring, or such, become likely to occur. Therefore, more advanced circuit design is required for such a high-density mounted printed circuit board.

For such a printed circuit board on which high-density mounting is carried out, degradation in signal characteristics in wiring may preferably be controlled. For this purpose, various methods have been carried out. For example, such a wiring structure that a solid pattern removed part is provided in a solid pattern for grounding or power supply, and signal characteristics may be improved, and such a printed circuit board that a width of a slit formed in a solid pattern for grounding or power supply is adjusted, and signal characteristics may be improved, or such, have been proposed.

[Patent Document 1] Japanese Laid-Open Patent Application No. 09-36504
[Patent Document 2] Japanese Laid-Open Patent Application No. 11-317572

In the above-described high-density mounting, an amount of work for designing a wiring structure in a printed circuit board becomes further greater, and the cost and time for the work become considerable. Therefore, for example, it may be difficult to calculate, for all the wiring, degradation degrees in signal characteristics during a design stage.

However, an apparatus that assist a designer to efficiently check degradation degrees in signal characteristics in wiring patterns, in wiring design of a high-density mounted printed circuit board has not been proposed.

SUMMARY

One embodiment of the present disclosure is a wiring design assisting apparatus that assists in design of wiring patterns that are formed in a printed circuit board. The wiring design assisting apparatus includes a first database that stores attribute information and position information that indicate attributes and positions of the wiring patterns in a manner in which the attribute information and the position information are associated with the wiring patterns; a second database that stores position information and size information that indicate positions and sizes of pattern removed areas that exist in solid patterns provided in the printed circuit board; a third database that stores degradation degree information that indicates degradation degrees in signal characteristics in the wiring patterns with respect to positional relationships between the wiring patterns and the pattern removed areas, and the sizes of the pattern removed areas; an input part that has attribute information of a wiring pattern input thereto; a degradation degree process part that obtains a degradation degree in signal characteristics in a wiring pattern corresponding to attribute information that is input to the input part, based on position information of the wiring pattern corresponding to the attribute information input to the input part, position information and size information of a pattern removed area, and the degradation degree information; and an extracting process part that extracts, for re-wiring, wiring patterns that have degradation degrees equal to or more than a predetermined degree, from wiring patterns for which degradation degrees have been obtained by the degradation degree process part.

The object and advantages of the disclosure will be realized and attained by means of the elements and combinations particularly pointed out in the claims.

It is to be understood that both the foregoing general description and the following detailed description are exemplary and explanatory and are not restrictive of the invention as claimed.

BRIEF DESCRIPTION OF DRAWINGS

FIGS. 3A and 3B depict an electronic apparatus for which calculation is carried out for assisting in wiring design of a printed circuit board by the wiring design assisting apparatus in the embodiment 1, where FIG. 3A depicts a perspective see through view of the electronic apparatus and FIG. 3B depicts the printed circuit board included in the electronic apparatus;

FIGS. 5A and 5B depict one example of CAD data used by the wiring design assisting apparatus in the embodiment 1;

FIG. 7 depicts one example of data indicating an extracting result provided by an extracting process part 216 included in the wiring design assisting apparatus in the embodiment 1;

FIG. 8 depicts one example of data indicating a result of grading of dielectric layers 5a, 5c and 5e carried out by a layer grading process part 217 of the wiring design assisting apparatus in the embodiment 1;

FIG. 9 depicts one example of data indicating a result of extracting of wiring patterns 6 carried out by a wiring grading process part 218 of the wiring design assisting apparatus in the embodiment 1;

FIG. 10 depicts one example of data indicating a result of allocating a wiring pattern carried out by an allocating process part 219 of the wiring design assisting apparatus in the embodiment 1;

FIG. 11 depicts one example of a result of classification of positional relationships between wiring patterns and solid pattern removed areas in the wiring design assisting apparatus in the embodiment 1;

FIG. 15 depicts a determination result of FIG. 14 in the form of a table;

FIG. 24 depicts a table of noise per unit area for calculating intensity of crosstalk per unit area of a crosstalk area in the wiring design assisting apparatus in the embodiment 2;

FIG. 25 depicts a table of a correction coefficient used in calculating intensity of crosstalk in the wiring design assisting apparatus in the embodiment 2;

FIG. 27 depicts in the form of a table a determination result of FIG. 26 together with an extracting result of distances between wiring patterns.

DESCRIPTION OF EMBODIMENTS

Below, embodiments applying a wiring design assisting apparatus, a wiring design assisting method and a computer-readable information recording medium according to the present invention.

Embodiment 1

Figure 1:
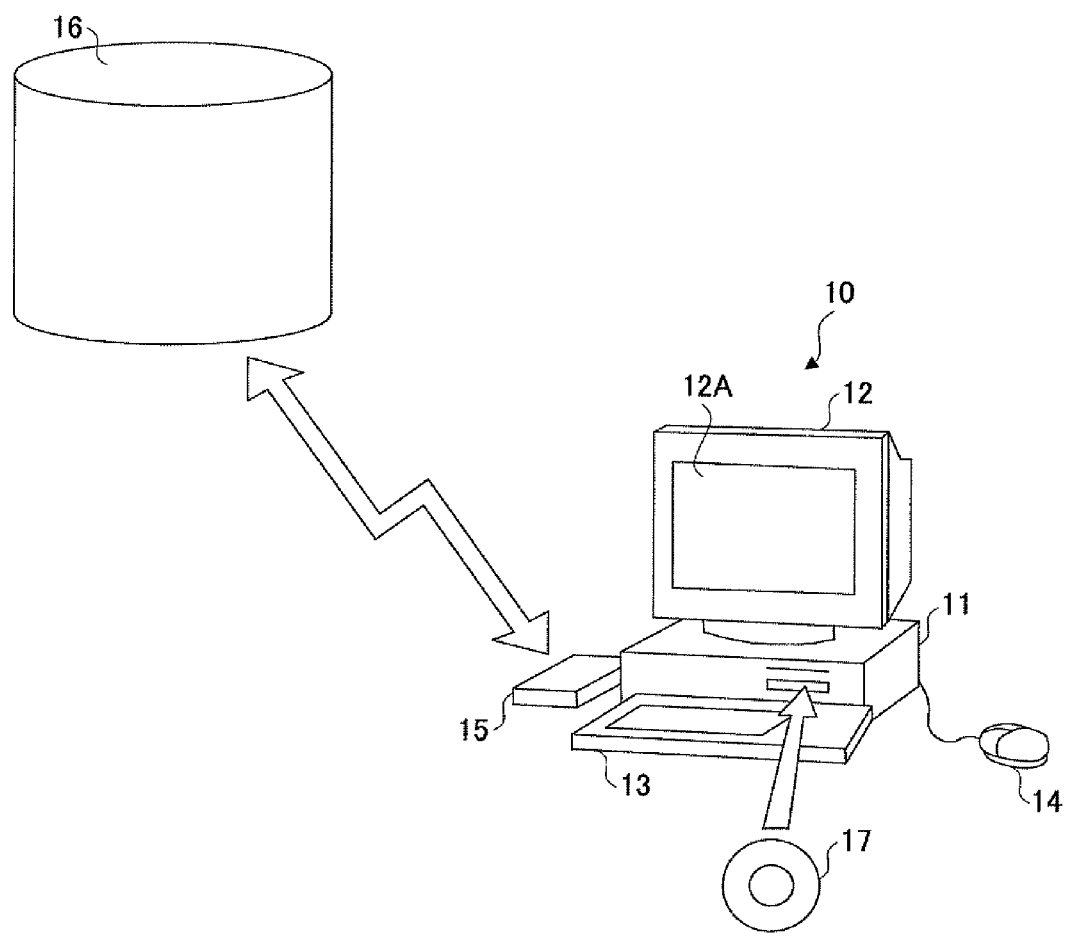
FIG. 1 depicts a perspective view of a computer system to which a wiring design assisting apparatus in an embodiment 1 is applied.

FIG. 1 depicts a perspective view of a computer system to which a wiring design assisting apparatus in an embodiment 1 is applied. The computer system 10 depicted in FIG. 1 includes a body part 11, a display 12, a keyboard 13, a mouse 14 and a modem 15.

The body part 11 has, built-in, a CPU (Central Processing Unit), a HDD (Hard Disk Drive), a disk drive, or such. The display 12 acts as a display part that displays an analysis result or such on a display screen 12A in response to an instruction given by the body part 11. The display 12 may be, for example, a liquid crystal display monitor. The keyboard 13 acts as an input part for inputting various sorts of information to the computer system 10. The mouse 14 acts as an input part for designating a position on the display screen 12A of the display 12. The modem 15 is used to access an external database or such, and download a program or such stored in another computer system.

The wiring design assisting program (wiring design assisting program software or tool) for causing the computer system 10 to have a function of assisting in wiring design of a printed circuit board is stored in a portable recording medium such as a disk 17 or such, or is downloaded from a recording medium 16 of another computer system by using a communication device such as the modem 15, is thus input to the computer system 10 and is compiled.

The wiring design assisting program causes the computer system 10 (i.e., a CPU 21 described later) to operate as a wiring design assisting apparatus having a function of assisting in wiring design of a printed circuit board. The wiring design assisting program may be, for example, stored in a computer-readable information recording medium such as the disk 17. The computer-readable information recording medium is not limited to a portable recording medium such as the disk 17, an IC card memory, a magnetic disk such as a Floppy® disk, a magneto-optical disc, a CD-ROM or such, and may be any one of various types of recording media to which accessing can be carried out from a computer system connected via the modem 15 or a communication device for a LAN or such.

Figure 2:
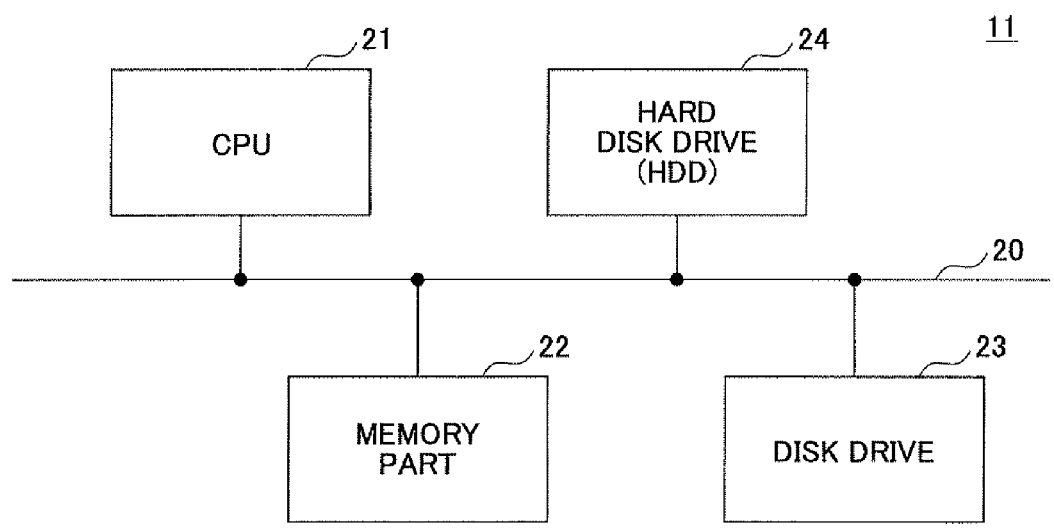
FIG. 2 depicts a block diagram roughly illustrating a configuration of a body part 11 of the computer system 10.

FIG. 2 is a block diagram roughly illustrating a configuration in the body part 11 of the computer system 10. The body part 11 includes the processor (CPU) 21, a memory part 22 including a RAM, ROM or such, a disk drive 23 for the disk 17, and a hard disk drive (HDD) 24, which are connected together by using a bus 20. In the embodiment 1, the display 12, the keyboard 13 and the mouse 14 are connected with the CPU 21 by using the bus 20. However, these parts may be directly connected with the CPU 21. Further alternatively, the display 12 may be connected with the CPU 21 by using a known graphic interface (not depicted) that processes input/output image data.

In the computer system 10, the keyboard 13 and the mouse 14 act as an input part of the wiring design assisting apparatus. The display 12 acts as a display part of the wiring design assisting apparatus which displays on the display screen 12A a calculation result obtained from the wiring design assisting function. The CPU 21 acts as, at least, a degradation degree process part that obtains degradation degrees of signal characteristics in wiring patterns, based on attribute information and position information of wiring patterns stored in a first database and position information of pattern removed areas stored in a second database, and an extracting process part that extracts, for re-wiring, wiring patterns having degradation degrees equal to or more than a predetermined degree from among plural wiring patterns for which degradation degrees have been obtained by the degradation degree process part.

The computer system 10 is not limited to one having a configuration depicted in FIGS. 1 and 2, and various known devices may be added, or may be used alternatively.

FIGS. 3A, 3B depict an electronic apparatus for which calculation for assisting in wiring design of a printed circuit board is carried out in the wiring design assisting apparatus in the embodiment 1. FIG. 3A depicts a perspective see-through view of the electronic apparatus and FIG. 3B depicts a printed circuit board included in the electronic apparatus. In the embodiment 1, as one example of the electronic apparatus, a cellular phone terminal 1 is depicted.

As depicted in FIG. 3A, a display part 3 and operating parts 4 are provided on an external surface of a housing 2 of the cellular phone terminal 1. In the inside of the housing 2, a printed circuit board 5 is housed as depicted by a broken line.

The housing 2 is made of a resin or a metal, and has openings for providing the display part 3 and the operating parts 4. The display part 3 may be, for example, a liquid crystal display panel that has a function of displaying characters, numerals, images and so forth. The operating parts 4 include various selecting keys for selecting functions of the cellular phone terminal 1, in addition to ten keys. It is noted that the cellular phone terminal 1 may include auxiliary equipment such as a near field communication device (infrared-ray communication device, a communication device for electronic money or such), or a camera.

The printed circuit board 5 depicted in FIG. 3B is made of, for example, a FR4 (glass fabric base epoxy resin) substrate, and wiring patterns 6 are formed on a surface 5A as a result of copper foils being patterned. The wiring patterns 6 act as transmission paths for transmitting various signals used for driving the electronic apparatus. The wiring patterns 6 are thus patterned by, for example, using an etching process that uses a resist.

An IC (Integrated Circuit) having a function of communications carried out by using the cellular phone terminal 1 such as telephone conversation, electronic mail, the Internet or such, a memory and so forth, are electrically connected to the wiring patterns 6.

In the FR4 substrate used as the printed circuit board 5, generally speaking, plural insulating layers are laminated, and patterned copper foils are provided between the respective insulating layers (interlayer), on the uppermost surface of the laminated structure, and on the lowermost surface of the laminated structure.

Therefore, wiring and circuits, used for carrying out communications, such as telephone conversation, electronic mail, the Internet, or such, may be formed, not only on the uppermost surface of the laminated structure, but also between the respective layers (interlayer) and/or on the lowermost surface of the laminated structure.

Further, the printed circuit board 5 is not limited to FR4, and any other substrate may be used as the printed circuit board 5 as long as the substrate is made of a dielectric, the wiring patterns 6 can be formed thereon, and circuits can be mounted thereon.

Further, the wiring patterns 6 are not limited to those made of copper (Cu). Any other metal may be used for the wiring patterns 6 as long as the metal has low power loss and high electric conductivity, for example, aluminum (Al) or such.

CAD (Computer Aided Design) data of the wiring patterns 6 formed in the printed circuit board 5 is stored in the HDD 24 depicted in FIG. 2.

It is noted that, in the printed circuit board 5, actually, plural layers are laminated together, and solid patterns for GND (ground) and power supply are also formed. Details thereof will be described next with reference to FIG. 4.

Figure 4:
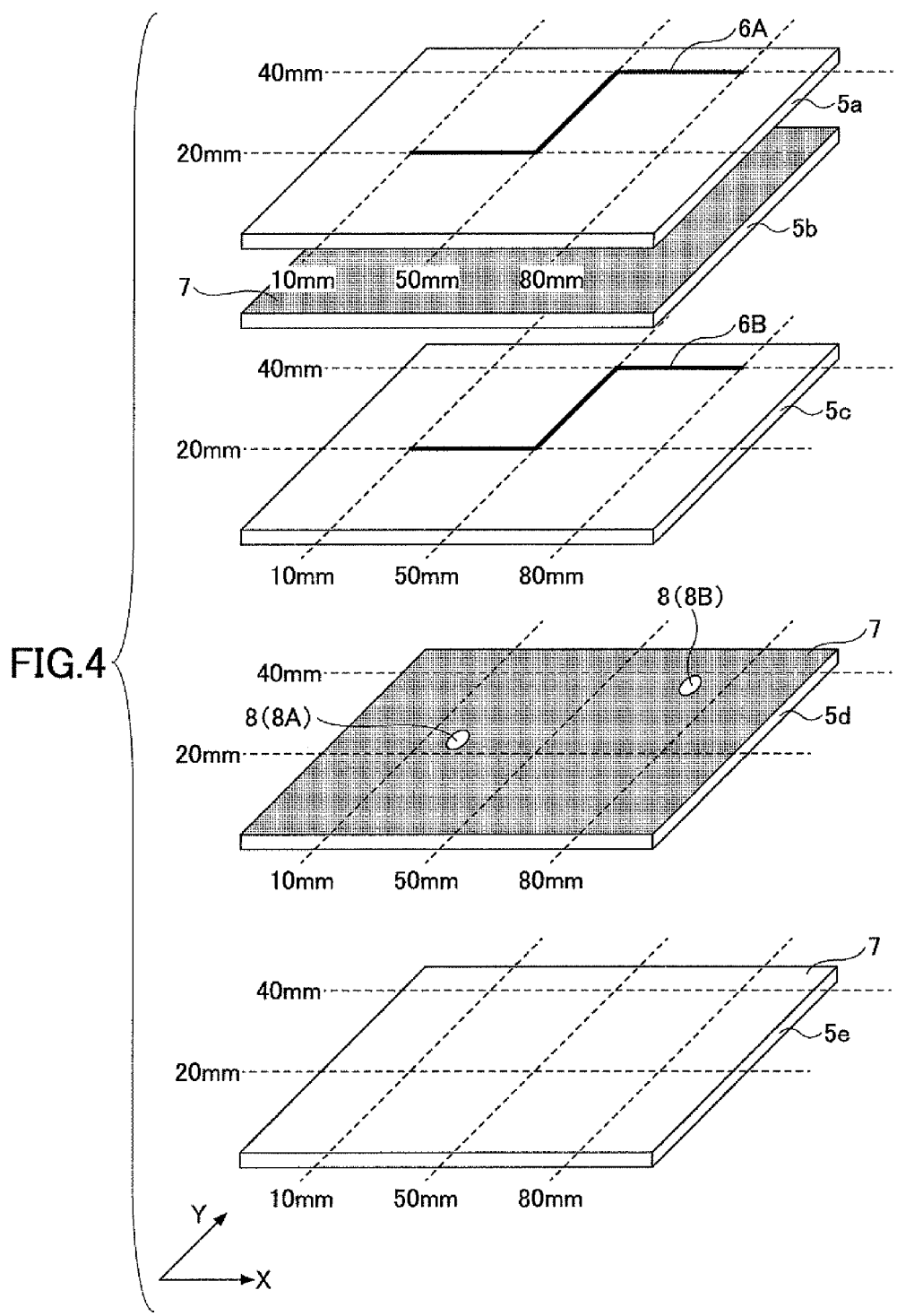
FIG. 4 depicts an exploded perspective view of a structure of a printed circuit board for which calculation is carried out for assisting in wiring design by the wiring design assisting apparatus in the embodiment 1.

FIG. 4 depicts a perspective exploded view of a printed circuit board for which calculation is carried out for assisting in wiring design of the printed circuit board by using the wiring design assisting apparatus in the embodiment 1.

The printed circuit board 5 depicted in FIG. 4 has a five layer structure. The printed circuit board 5 includes wiring patterns 6 and solid patterns 7. In the printed circuit board 5 depicted in FIG. 4, the wiring patterns 6 and the solid patterns 7 are formed on any dielectric layers 5a through 5e. The dielectric layers 5a through 5e are made of any of core materials and adhesion layers.

The wiring patterns 6 are wiring or patterns having predetermined shapes used to transmit signals. The solid patterns 7 are formed to be planes, are kept at ground electric potential and act as returning paths. Therefore, the wiring patterns 6 and the solid patterns 7 are designed so that signal characteristics in the wiring patterns 6 are satisfactory (typically, impedance matching is obtained (for example, 50Ω)).

FIG. 4 depicts the printed circuit board 5 in a state in which the five layers of the printed circuit board 5, i.e., the uppermost dielectric layer 5a, the second dielectric layer 5b, the third dielectric layer 5c, the fourth dielectric layer 5d and the fifth dielectric layer 5e, are separated. On the dielectric layers 5a and 5c, wiring patterns 6A and 6B are formed, respectively. On the dielectric layers 5b and 5d, solid patterns 7 are formed, respectively. In the solid pattern 7 formed on the dielectric layer 5d, solid pattern removed areas 8 (8A, 8B) are formed. The solid pattern removed areas 8A and 8B are areas in the solid pattern 7 in which the solid pattern 7 is removed, for the purpose of passing interlayer wiring therethrough, for example. It is noted that, in the description below, the reference numeral 6 is used to denote wiring patterns in a case where the wiring patterns 6A and 6B are not distinguished therebetween. Similarly, it is noted that, in the description below, the reference numeral 8 is used to denote solid pattern removed areas in a case where the solid pattern removed areas 8A and 8B are not distinguished therebetween.

Here, for the sake of convenience in explanation, wiring patterns 6 formed on the dielectric layer 5e are omitted from FIG. 4. However, actually, in the printed circuit board 5, layers on which wiring patterns 6 are formed which are used as signal lines or such, and layers on which solid patterns 7 are formed, are laminated alternately.

Further, although FIG. 4 depicts the solid patterns 7 that are kept at the ground electric potential, the printed circuit board 5 may include, in addition to the solid patterns 7 kept at the ground electric potential, solid patterns for power supply that are kept at a predetermined positive or negative electric potential.

Further, the lowermost dielectric layer 5e may not be included in the printed circuit board 5 depicted in FIG. 4, and thus, wiring patterns 6 may be formed on the reverse side of the dielectric layer 5d.

It is noted that coordinates in an X axis direction and a Y axis direction depicted in FIG. 4 will be described with reference to FIGS. 5A and 5B.

FIGS. 5A and 5B depict one example of CAD data used by the wiring design assisting apparatus in the embodiment 1. The CAD data includes a size of each layer included in the printed circuit board 5, positions and sizes of vias or such formed in the printed circuit board 5, layer numbers, signal types, data rates, dielectric constants, electric conductivities, wiring widths, copper foil thicknesses (wiring thicknesses), interlayer distances, wiring heights, start-point coordinates, end-point coordinates, and so forth of respective wiring patterns formed in the printed circuit board 5.

The CAD data of the printed circuit board 5 is stored in the HDD 24 depicted in FIG. 2.

A table depicted in FIG. 5A corresponds to a first database in which identifiers, layer numbers, signal names, data rates, dielectric constants, wiring widths, wiring thicknesses, interlayer distances, start-point coordinates and end-point coordinates of the wiring patterns 6 are associated together, as depicted in FIG. 5A. The signal names indicate signal types of signals transmitted by the wiring patterns 6, and are included in the first database as one example of attribute information indicating attributes of the wiring patterns 6. The wiring widths, wiring thicknesses, interlayer distances, wiring heights, start-point coordinates and end-point coordinates are included in the first database as one example of position information of the wiring patterns 6. It is noted that the interlayer distance means a distance between solid patterns 7. That is, in FIG. 4, the interlayer distance indicates a distance between the respective solid patterns 7 on the dielectric layers 5b and 5d. The wiring height means a height of the wiring patterns 6 with respect to the solid pattern 7. In FIG. 4, the wiring height indicates a height of the wiring patterns 6 on the dielectric layer 5c with respect to the solid pattern 7 on the dielectric layer 5d.

A table depicted in FIG. 5B corresponds to a second database in which identifiers, layer numbers, diameters and center coordinates of solid pattern removed areas are associated together. The identifiers, layer numbers, diameters and center coordinates of solid pattern removed areas indicate one example of position information and size information of solid pattern removed areas 8 formed in solid patterns 7.

X coordinate values and Y coordinate values of the start-point coordinates and end-point coordinates depicted in FIG. 5A, and X coordinate values and Y coordinate values of the center coordinates depicted in FIG. 5B, indicate coordinates in the X axis and the Y axis depicted in FIG. 4.

The wiring patterns having identifiers No. 1 through No. 6 depicted in FIG. 5A indicate the wiring patterns 6A and 6B formed on the dielectric layers 5a and 5c depicted in FIG. 4. A data signal having a signal name "data001" is transmitted to the wiring patterns 6A and 6B.

Solid pattern removed areas of identifiers No. 1 and No. 2 depicted in FIG. 5B indicate the solid pattern removed areas 8A and 8B formed on the dielectric layer 5d depicted in FIG. 4.

As depicted in FIG. 4, the wiring pattern 6B and the solid pattern removed areas 8A, 8B are close together. As to this positional relationship, as can also be seen from the coordinate values depicted in FIGS. 5A and 5B, the wiring pattern of No. 4 and the solid pattern removed area of No. 1 (8A) are close together, and the wiring pattern of No. 6 and the solid pattern removed area of No. 2 (8B) are close together.

As the wiring patterns 6 and the solid pattern removed areas 8A, 8B are thus close together, a state of characteristic impedance mismatching may occur in the wiring patterns 6. Such impendence mismatching may cause signal characteristic degradation.

A case where signal characteristic degradation occurs in the wiring patterns 6 because of the solid pattern removed areas is a case where, in the printed circuit board 5 depicted in FIG. 4, the solid pattern removed areas 8A, 8B exist in the dielectric layer 5c, the dielectric layer 5b or the dielectric layer 5d, which is the same dielectric layer 5c on which the wiring pattern 6B is formed, the dielectric layer 5b one layer above the dielectric layer 5c or the dielectric layer 5d one layer below the dielectric layer 5c, and also, the wiring patterns 6 and the solid pattern removed areas 8A, 8B are close together in a plan view manner.

The wiring design assisting apparatus in the embodiment 1 obtains a wiring pattern having a large characteristic impedance degradation degree by calculation for the purpose of improving work efficiency in a stage of designing a wiring structure of the printed circuit board 5. In calculating the characteristic impedance degradation degree, a range in a width direction with respect to the wiring pattern 6 is determined. As to determination of a range in a width direction, description will be made later with reference to FIG. 13. Here, a configuration of the wiring design assisting apparatus in the embodiment 1 will be described with reference to FIG. 6.

Figure 6:
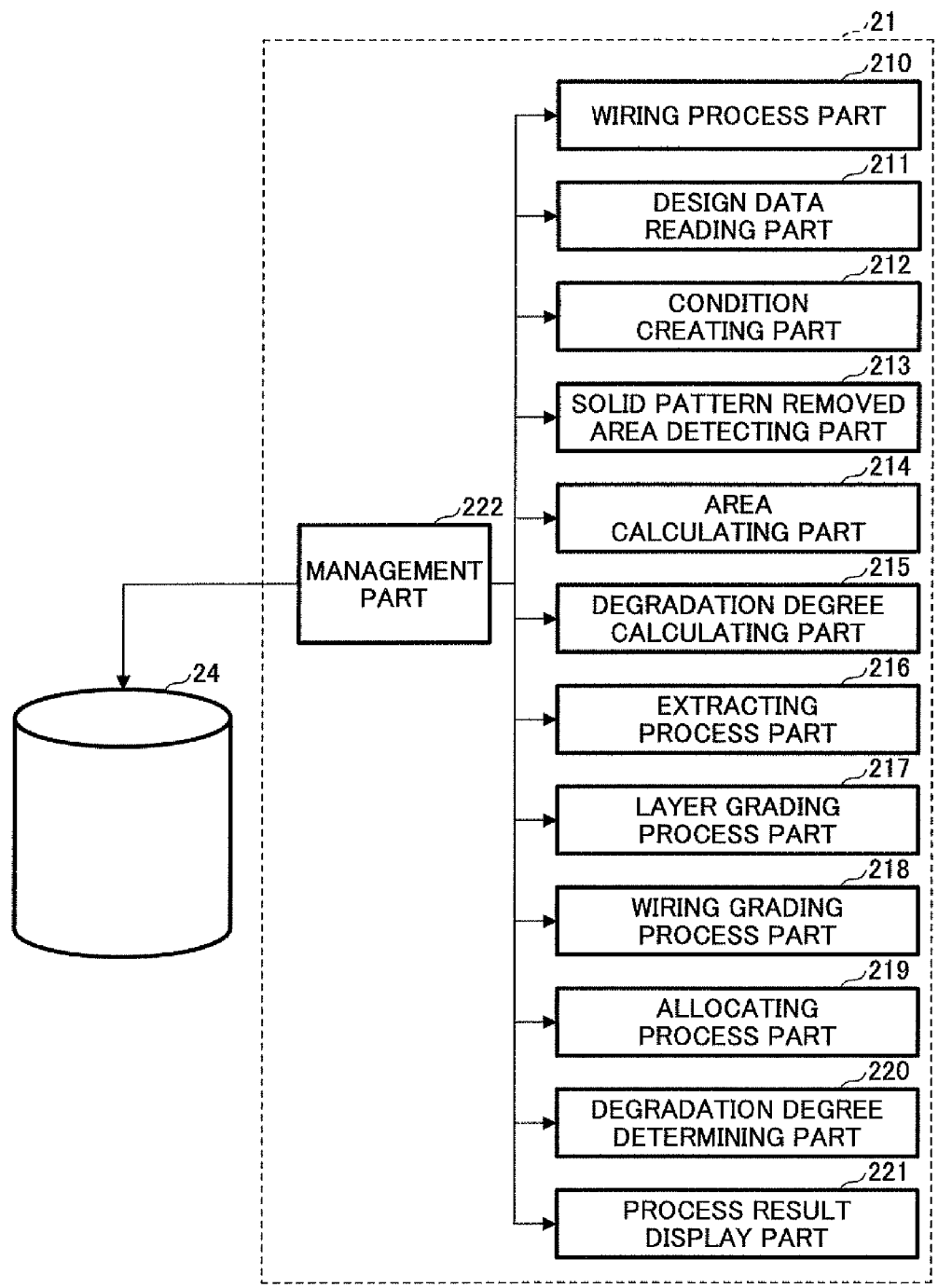
FIG. 6 depicts a functional block diagram of the wiring design assisting apparatus in the embodiment 1.

FIG. 6 is a functional block diagram depicting functions of the wiring design assisting apparatus in the embodiment 1. The functional block is realized as a result of the CPU 21 depicted in FIG. 2 executing the wiring design assisting program stored in the HDD 24.

The functional block realized by the CPU 21 includes a wiring process part 210, a design data reading part 211, a condition creating part 212, a solid pattern removed area detecting part 213, an area calculating part 214, a degradation degree calculating part 215, an extracting process part 216, a layer grading process part 217, a wiring grading process part 218, an allocating process part 219, a degradation degree determining part 220, a process result displaying part 221, and a management part 222.

It is noted that, in the description below, a result of extracting by the extracting process part 216 (FIG. 7), a result of grading of the dielectric layers (5a, 5c and 5e) by the layer grading process part 217 (FIG. 8), a result of grading of the wiring patterns 6 by the wiring grading process part 218 (FIG. 9), and a result of allocating the wiring pattern 6 by the allocating process part 219 (FIG. 10) will be used.

The wiring process part 210 carries out automatic wiring of the wiring patterns 6, the solid patterns 7, the solid pattern removed areas 8, devices mounted on the printed circuit board 5, and so forth. More specifically, the automatic wiring is a process of creating CAD data indicating mutual connecting relationships and coordinates of the wiring patterns 6, the solid patterns 7, the solid pattern removed areas 8, devices mounted on the printed circuit board 5, and so forth, by using CAD data indicting the devices mounted on the printed circuit board 5 and so forth. As a result of the wiring process part 210 thus carrying out automatic wiring, the CAD data depicted in FIGS. 5A and 5B is created. The created CAD data is stored in the HDD 24 by the management part 222.

The design data reading part 211 reads the CAD data stored in the HDD 24. The CAD data is created by the wiring process part 210 (see FIGS. 5A and 5B).

The condition creating part 212 creates conditions used for calculating a characteristic impedance degradation degree described below, based on conditions input via the keyboard 13 or the mouse 14. As the input conditions, for example, the signal type of the signal transmitted by the wiring patterns 6, a range in a width direction used for calculating a characteristic impedance degradation degree, a length of a side of a mesh used for calculating an area of the solid pattern removed area 8, an extracting condition for extracting the wiring pattern 6 (for example, a value indicating a shift of characteristic impedance), a threshold of impedance used for extracting for the purpose of grading, or such, may be cited.

The solid pattern removed area detecting part 213 classifies positional relationships of the solid pattern removed areas 8 with respect to the wiring patterns 6 in a plan view manner, based on the X coordinates and the Y coordinates of the wiring patterns 6 depicted in FIG. 5A, and the X coordinates and the Y coordinates of the solid pattern removed areas 8 depicted in FIG. 5B, and creates a classification result. Details will be described later with reference to FIG. 11.

The area calculating part 214 extracts the wiring patterns 6 as targets by using the signal type (signal name) of the signal transmitted by wiring patterns 6 created by the condition creating part 212, and calculates an area of a solid pattern removed area existing within the range in the width direction used for calculating the characteristic impedance degradation degree in the plan view manner.

The degradation degree calculating part 215 calculates shifts of characteristic impedance from an ideal value (typically, 50Ω) as the characteristic impedance degradation degrees of the wiring patterns 6 as the targets of calculation, by using the positional relationships between the wiring patterns 6 and the solid pattern removed areas 8 classified by the solid pattern removed area detecting part 213, and the areas of the solid pattern removed areas 8 calculated by the area calculating part 214.

The extracting process part 216 extracts, for re-wiring, a wiring pattern having the degradation degree equal to or more than a predetermined degree, from among the plural wiring patterns for which the degradation degrees have been obtained by the degradation degree calculating part 215. An identifier (No.) of the extracted wiring pattern 6 is displayed on the display screen 12A of the display 12 by the process result display part 221, as depicted in FIG. 7. FIG. 7 depicts the wiring patterns 6 having the shifts of characteristic impedance equal to or more than 1Ω.

The layer grading process part 217 calculates, for each of the dielectric layers 5a, 5c and 5e, an extraction degree that indicates a degree in which the degradation degree calculating part 215 extracts the wiring patterns 6, and grades the respective dielectric layers 5a, 5c and 5e according to the extraction degrees of the wiring patterns 6. The layer grading process part 217 acts as an extraction degree process part that obtains an extraction degree for each of the dielectric layers 5a, 5c and 5e, and calculates, as the extraction degree, a total amount of the shifts of characteristic impedance in each of the dielectric layers 5a, 5c and 5e. The total amount of the shifts of characteristic impedance in each of the dielectric layers 5a, 5c and 5e is displayed on the display screen 12A of the display 12 by the process result display part 221 together with the corresponding layer number, as depicted in FIG. 8, for example.

The total amount of the shifts of characteristic impedance in each of the dielectric layers 5a, 5c and 5e is not calculated for all the wiring patterns 6 existing in each of the dielectric payers 5a, 5c and 5e, and is calculated for the wiring patterns 6 that are identified by the signal type transmitted by the wiring pattern 6 created by the condition creating part 212, and further, are extracted by the extracting process part 216.

The wiring grading process part 218 creates data in which the wiring patterns 6, that exist in the dielectric layer (any of 5a, 5c and 5e) determined as having the largest total amount of the shifts of characteristic impedance by the layer grading process part 217, are graded according to the shifts of characteristic impedance in a descending order. A result of the grading is displayed on the display screen 12A of the display 12 by the process result display part 221 together with the corresponding identifiers (Nos.) of the wiring patterns 6, for example, as depicted in FIG. 9.

The allocating process part 219 allocates the wiring pattern 6 that has the largest shift of characteristic impedance according to the grading carried out by the wiring grading process part 218 to the dielectric layer (any of 5a, 5c and 5e) which is determined as having the smallest total amount of the shifts of characteristic impedance by the layer grading process part 217. The allocating process part 219 creates an allocation result that indicates the layer number associated with the identifier (No.) of the corresponding wiring pattern 6, and the layer number of the dielectric layer to which the wiring pattern 6 is thus allocated. The allocation result, for example, as depicted in FIG. 10, includes the identifier (No.) of the wiring pattern 6 for which allocation is thus changed, the current layer number, and the layer number of the dielectric layer to which the wiring pattern 6 is thus allocated, and, is displayed on the display screen 12A of the display 12 by the process result display part 221.

It is noted that, when the wiring pattern 6 is thus allocated by the allocating process part 219, the wiring process part 210 carries out a re-wiring process accordingly. After the re-wiring process is thus finished, the degradation degree calculating part 215 again calculates shifts of characteristic impedance of the wiring patterns that exist in the dielectric layers (any of 5a, 5c and 5e) for which the re-wiring process is thus carried out.

The degradation degree determining part 220 calculates the total amounts of the shifts of characteristic impedance of the wiring patterns 6 that exist in the dielectric layers (any of 5a, 5c and 5e) for which the re-wiring has been thus carried out by the wiring process part 210, and determines whether the total amounts are equal to or less than a criterion. A determination result is displayed on the display screen 12A of the display 12 by the process result display part 221.

The process result display part 221 displays, on the display screen 12A of the display 12 depicted in FIG. 1, the identifiers (Nos.) of the wiring patterns 6 thus extracted for re-wiring, the total amount of the shifts of characteristic impedance of each of the dielectric layers 5a, 5c and 5e together with the layer number, the results of grading, the identifier (No.) of the wiring pattern 6 for which allocation is thus changed, the current layer number and the layer number to which the wiring pattern 6 is thus allocated, and the determination result of the degradation degree determining part 220.

The management part 222 acts as a data management part that manages storing of data in the HDD 24.

Next, determination of a positional relationship between a wiring pattern and a solid pattern removed area in the wiring design assisting apparatus in the embodiment 1 will be described. Determination of the positional relationship is carried out by the solid pattern removed area detecting part 213 (see FIG. 6).

FIG. 11 depicts one example of a result of classification of positional relationships between wiring patterns and solid pattern removed areas in the wiring design assisting apparatus in the embodiment 1.

The solid pattern removed area detecting part 213 classifies positions of the solid pattern removed areas 8 with respect to the wiring patterns 6 in the plan view manner based on the X coordinates and Y coordinates of the wiring patterns 6 depicted in FIG. 5A and the X coordinates and Y coordinates of the solid pattern removed areas 8 depicted in FIG. 5B.

Further, in addition to the classification of the positional relationships in the plan view manner, the solid pattern removed area detecting part 213 determines whether the solid pattern removed areas 8 exist in the same layer as that of the wiring patterns 6, the layer that is one layer above it, or the layer that is one layer below it (i.e., whether the solid pattern removed areas and the wiring patterns are not separated from each other by equal to or more than two layers).

Specifically, the solid pattern removed area detecting part 213 calculates positional relationships in the X-Y coordinates between the X coordinates and the Y coordinates of the start points and the end points that indicate respective sections of the wiring patterns 6 depicted in FIG. 5A, and the X coordinates and the Y coordinates of the solid pattern removed areas 8 depicted in FIG. 5B, and thus, classifies the positions of the solid pattern removed areas 8 with respect to the wiring patterns 6 in the plan view manner. The positions of the solid pattern removed areas 8 with respect to the wiring patterns 6 in the plan view manner are classified in any one of, on one side of the wiring, on both sides of the wiring, or immediately above or immediately below of the wiring.

Further, the solid pattern removed area detecting part 213 determines whether a value obtained from subtracting the layer number of the solid pattern removed area 8 depicted in FIG. 5B from the layer number of the wiring pattern 6 depicted in FIG. 5A, is any one of 0, +1, and −1. In a case where the value is equal to or more than +2 or equal to or less than −2, it is expected that another solid pattern 7 exists between the wiring pattern 6 and the solid pattern removed area 8. Therefore, it is expected that no relationship exists in signal characteristic degradation between the wiring pattern 6 and the solid pattern removed area 8 for which the determination is carried out.

By carrying out the determinations, the solid pattern removed area detecting part 213 classifies the positional relationships between the wiring patterns 6 and the solid pattern removed areas 8, and creates data indicating the classification result depicted in FIG. 11.

Figure 12:
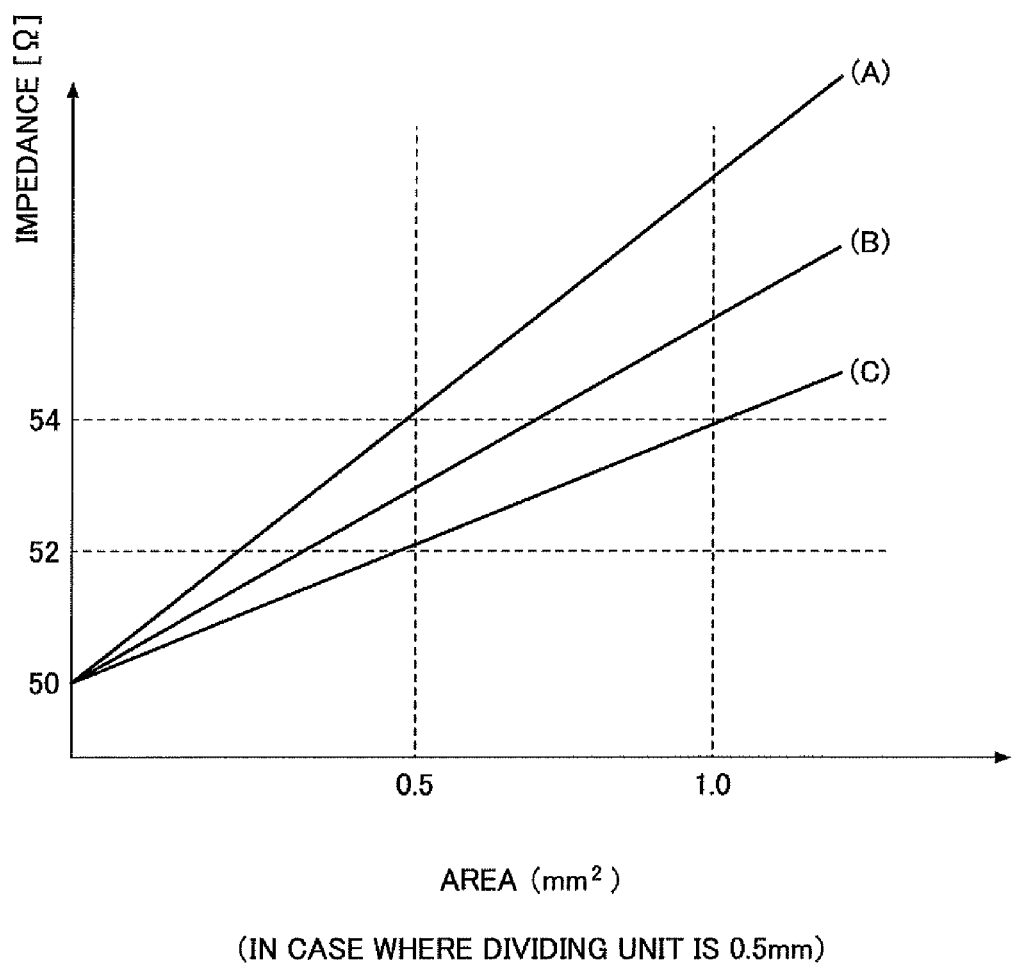
FIG. 12 depicts characteristic impedance increased characteristics stored in a database 20 of the wiring design assisting apparatus in the embodiment 1.

FIG. 12 depicts characteristic impedance increased characteristics stored in the database 20 of the wiring design assisting apparatus in the embodiment 1. The data indicating the increased characteristics is used to calculate the characteristic impedance degradation degree, and indicates a characteristic impedance increase (degradation) per unit area of the solid pattern removed area 8 with respect to the positional relationship between the wiring pattern 6 and the solid pattern removed area 8. The data indicating the increased characteristics depicted in FIG. 12 is one form of degradation degree information indicating a degradation degree in signal characteristics in the wiring pattern 6 with respect to the positional relationship between the wiring pattern 6 and the solid pattern removed area 8 and a size of the solid pattern removed area 8, and is stored in the HDD 24 as a third database.

The positional relationship between the wiring pattern 6 and the solid pattern removed area 8 is classified in any one of three patterns, i.e., (A) the solid pattern removed area 8 exists immediately above or immediately below the wiring pattern 6; (B) the solid pattern removed areas 8 exist on both sides of the wiring pattern 6; and (C) the solid pattern removed area 8 exists only on one side of the wiring pattern 6 (see FIG. 11). It is noted that such a positional relationship between the wiring pattern 6 and the solid pattern removed area 8 that it is expected that no relationship exists in signal characteristic degradation between the wiring pattern 6 and the solid pattern removed area 8 is not included in the above-mentioned three patterns (A), (B) and (C). It is assumed that an ideal characteristic impedance of the wiring pattern is 50Ω. As a result, because a characteristic impedance mismatching degree increases in the stated order of the patterns (C), (B) and (A), the characteristics depicted in FIG. 12 have an increased coefficient (a slope of the characteristics) such that the characteristic impedance in the positional relationship (A) is the highest, and the characteristic impedance decreases in the stated order of the positional relationships (B) and (C).

The wiring design assisting apparatus in the embodiment 1 calculates the characteristic impedance degradation degree in the wiring pattern 6 based on the area of the solid pattern removed area 8 that exists within a range determined as a range for calculating the characteristic impedance degradation degree, and the positional relationship of the solid pattern removed area 8 with respect to the wiring pattern 6.

Figure 13:
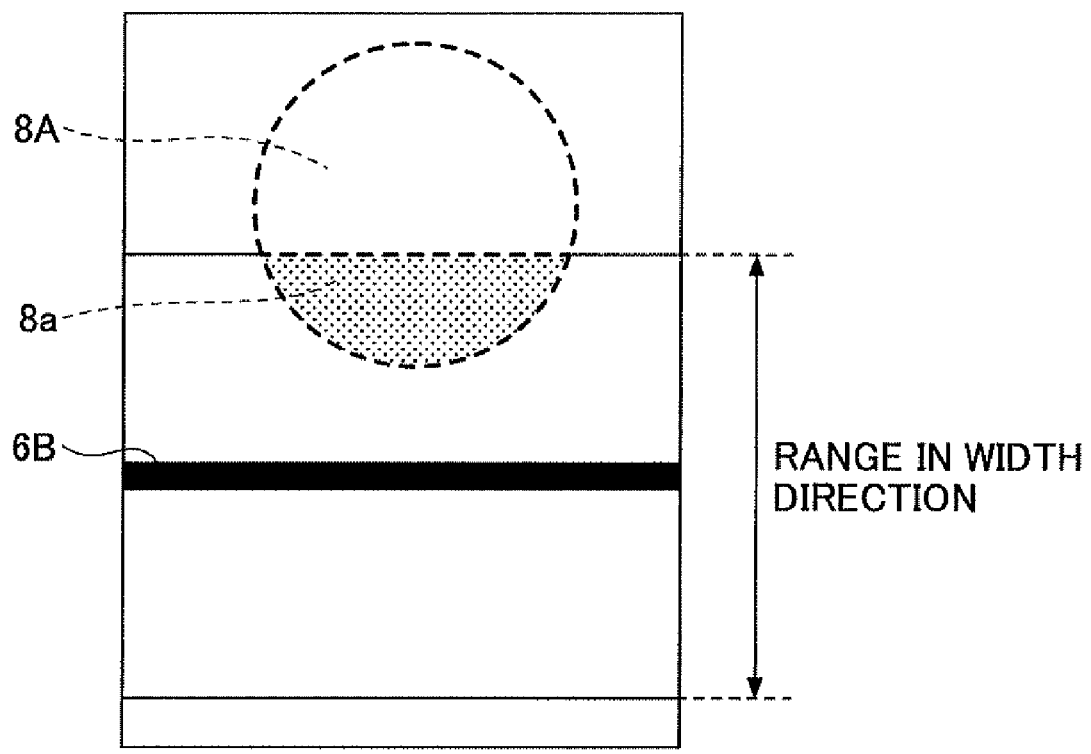
FIG. 13 illustrates a range in a width direction for which a characteristic impedance degradation degree is calculated in the wiring design assisting apparatus in the embodiment 1.

FIG. 13 illustrates a range in a width direction for calculating the characteristic impedance degradation degree in the wiring design assisting apparatus in the embodiment 1. FIG. 13 depicts, in a magnified manner, the positional relationship between the wiring pattern 6B formed on the dielectric layer 5*c* and the solid pattern removed area 8A formed in the dielectric layer 5*d* depicted in FIG. 4, and a range in a width direction for calculating the characteristic impedance degradation degree (i.e., a range in a width direction for which calculation is carried out).

In the wiring design assisting apparatus in the embodiment 1, the characteristic impedance degradation degree is calculated after the range in the width direction for which the calculation is carried out is previously determined.

The range in the width direction for which the calculation is carried out is input via a parameter input part 10 (see FIG. 1).

For example, it is assumed that the range in the width direction is input as 40 times (4.0 mm) a wiring width (0.1 mm) of the wiring pattern 6B.

As depicted in FIG. 13, a part 8*a* (filled with halftone dots) of the solid pattern removed area 8A close to the wiring pattern 6B is included within 4.0 mm (the range in the width direction) from the wiring pattern 6B in the plan view manner.

In the wiring design assisting apparatus in the embodiment 1, the characteristic impedance degradation degree (or characteristic impedance changing amount) in the wiring pattern 6B caused by the part 8*a* of the solid pattern removed area 8A is obtained, which part is included in the range in the width direction for which the calculation is carried out. By thus determining the characteristic impedance degradation degree, it is possible to determine an influence on the signal characteristics of the wiring pattern 6B. By the same way, it is possible to determine an influence on the signal characteristics of all the wiring patterns 6.

Figure 14:
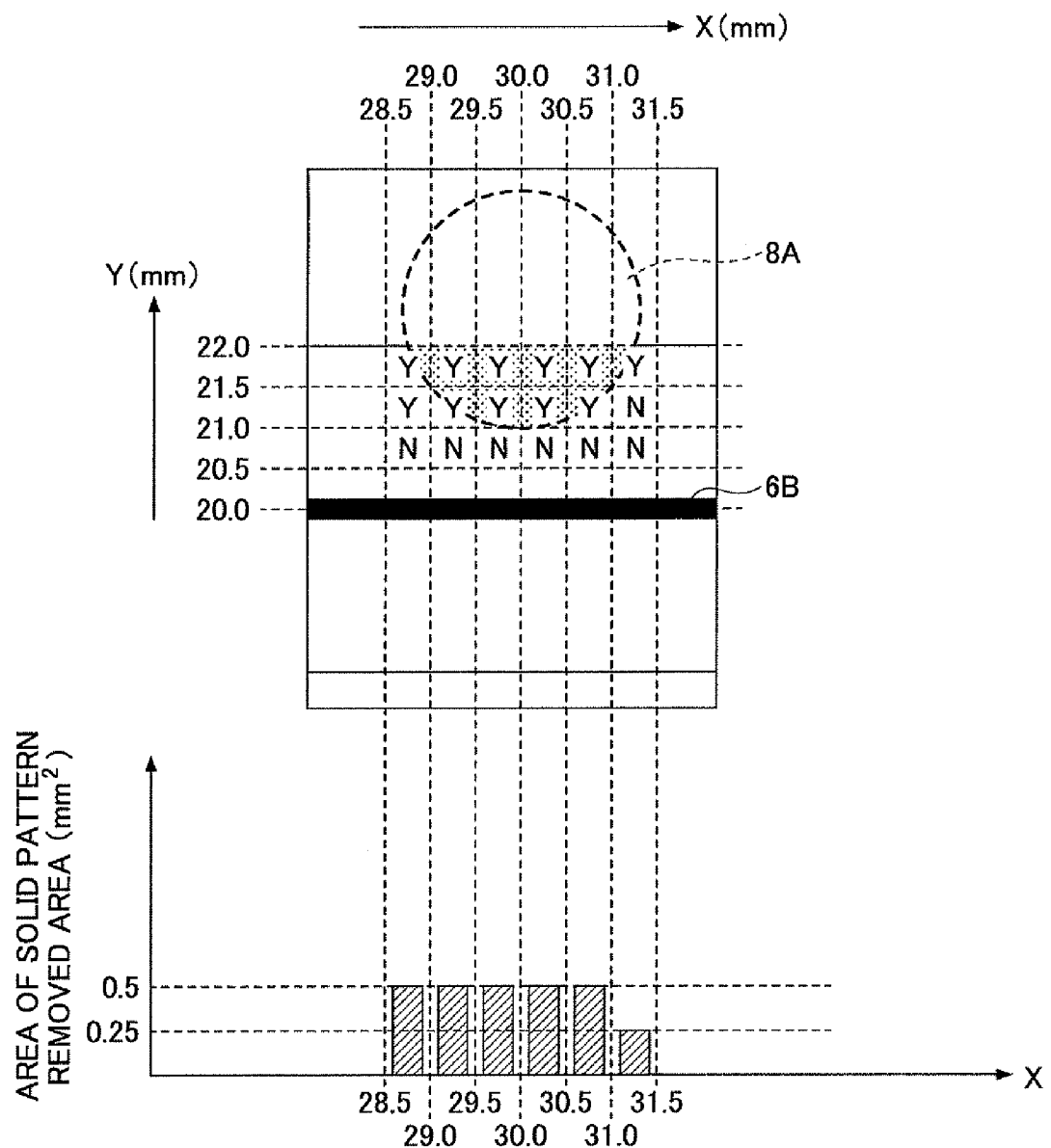
FIG. 14 illustrates a method of calculating an area of a solid pattern removed area existing in a range for which a characteristic impedance degradation degree is calculated in the wiring design assisting apparatus in the embodiment 1.

FIG. 14 illustrates a method of calculating an area of a part of a solid pattern removed area, which part exists within the range in the width direction for which the wiring design assisting apparatus in the embodiment 1 calculates the characteristic impedance degradation degree.

The solid pattern removed area detecting part 213 detects the part of the solid pattern removed area 8, which part is included in the range in the width direction for which the characteristic impedance degradation degree is calculated, and the area calculating part 214 calculates the part of the solid pattern removed area 8 based on the detection result of the solid pattern removed area detecting part 213.

In the detection and calculation of the part of the solid pattern removed area 8, an area included in the range in the width direction is divided into square meshes having predetermined areas, from the start point to the end point of the wiring pattern 6 for which the characteristic impedance degradation degree is calculated. Then, the wiring pattern 6 is divided into sections having lengths equal to sides of the meshes, respectively, and it is determined whether the solid pattern removed area 8 exists for each mesh.

In the determination of whether the solid pattern removed area 8 exists for each mesh, it is determined that the solid pattern removed area 8 exists in the mesh when the solid pattern removed area 8 exists in at least a part of the mesh. That is, a case where it is determined that the solid pattern removed area 8 does not exist in the mesh is a case where the solid pattern removed area 8 does not exist in the mesh at all. In FIG. 14, "Y" denotes a state in which the solid pattern removed area 8 exists in at least a part of the mesh (simply referred to as "the solid pattern removed area 8 exists", hereinafter), and "N" denotes a state in which the solid pattern removed area 8 does not exist in the mesh at all (simply referred to as "the solid pattern removed area 8 does not exist", hereinafter).

It is noted that a length of a side of the mesh is determined to be, for example, a value indicated by the following formula (1):

(length of a side of the mesh)=(rise time)×(propagation velocity in transmission path)/(any dividing number)     (1)

Here, the length of a side of the mesh is determined as 0.5 mm, and therefore, the wiring pattern 6B is divided in the length direction into sections each having 0.5 mm, and the area calculating part 214 calculates an area of the solid pattern removed area 8 for each section.

As a coordinate identifying the mesh, a coordinate having the smallest value is used from among respective coordinates of the four corners of the mesh. In the example of FIG. 14, a coordinate value of a bottom left vertex of the mesh is used as a coordinate to identify the mesh.

In the example of FIG. 14, for the meshes included in a range of X=28.5 through 31.5, and Y=20.0 through 22.0, it is determined whether the solid pattern removed area 8 exists in the mesh for each section divided every 0.5 mm in the X-axis direction. It is noted that, in FIG. 14, "Y" is indicated for the mesh for which it is determined that the solid pattern removed area 8 exists, and "N" is indicated for the mesh for which it is determined that the solid pattern removed area 8 does not exist.

Further, a total area of the solid pattern removed areas 8 of "Y" for each section of the wiring pattern 6 (solid pattern removed area (mm$^2$) in FIG. 10) is, according to the number of meshes of "Y": 0.5 mm$^2$ for a range of X=28.5 through 29.0; 0.5 mm$^2$ for a range of X=29.0 through 29.5; 0.5 mm$^2$ for a range of X=29.5 through 30.0; 0.5 mm$^2$ for a range of X=30.0 through 30.5; 0.5 mm$^2$ for a range of X=30.5 through 31.0; and 0.25 mm$^2$ for a range of X=31.0 through 31.5.

FIG. 15 depicts the results of the determinations of FIG. 14 in a form of a table.

As depicted in FIG. 15, for the mesh for which the solid pattern removed area exists ("Y"), a flag "1" is given, while for the mesh for which the solid pattern removed area does not exist ("N"), a flag "0" is given. The flag is used by the degradation degree calculating part 215 to calculate the characteristic impedance degradation degree.

In the determination results depicted in FIG. 15, the total area of meshes of "Y" for each section of the wiring pattern 6B is calculated as a result of the number of the flags "1" indicating that the solid pattern removed area exists ("Y") for each section being multiplied with the unit area (0.25 mm$^2$) of the mesh.

Figure 16:
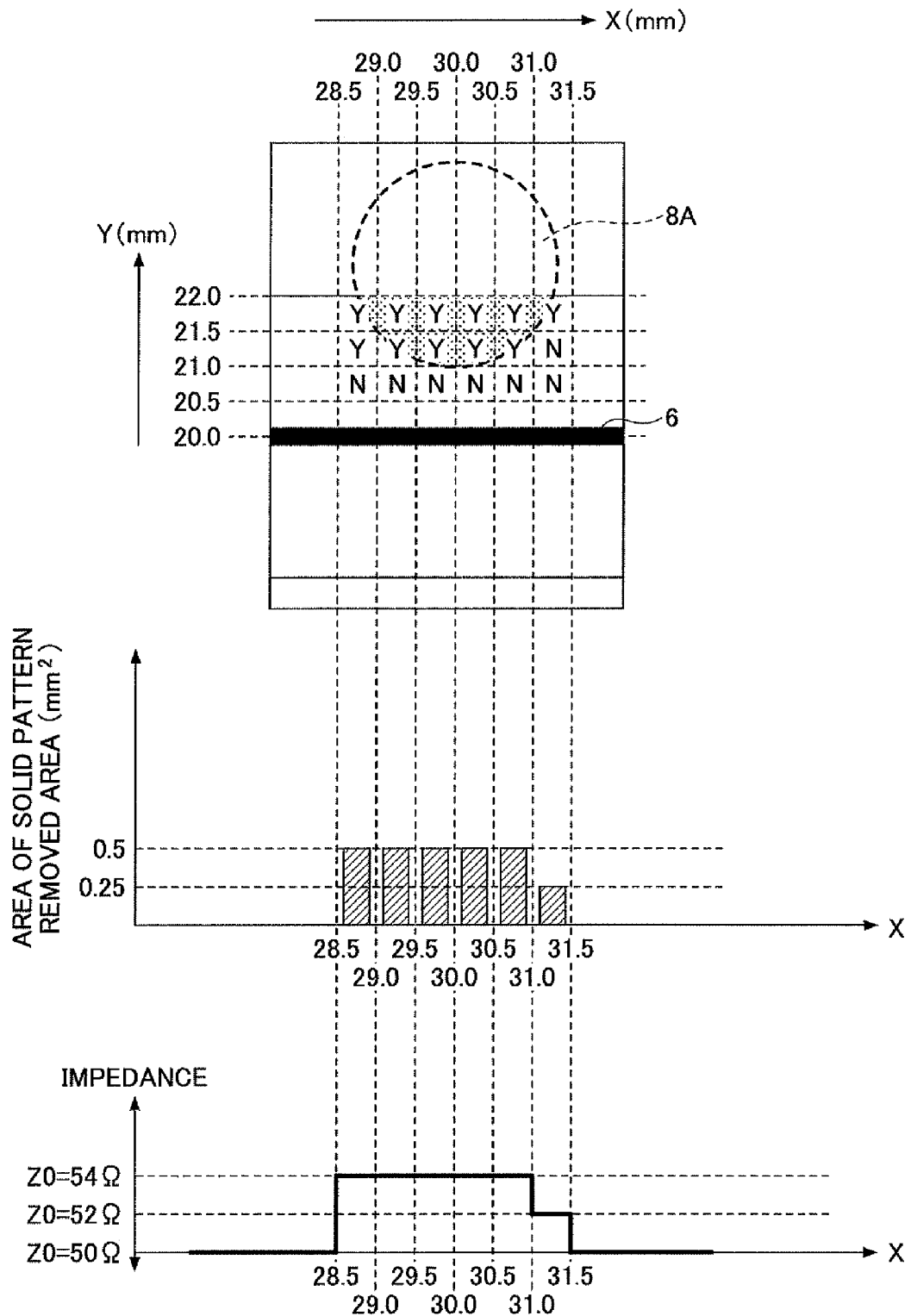
FIG. 16 depicts characteristic impedance of a wiring pattern that is influenced by a solid pattern removed area depicted in FIG. 14.

FIG. 16 depicts characteristic impedance of the wiring pattern 6B which is influenced by the solid pattern removed area 8 depicted in FIG. 14. The characteristic impedance of FIG. 16 is calculated by the degradation degree calculating part 215 based on the characteristics depicted in FIG. 12 and the determination results of FIG. 15.

As mentioned above, the degradation degree calculating part 215 calculates the characteristic impedance of the wiring pattern 6 by using the characteristics depicted in FIG. 12 and the determination results of FIG. 15.

The characteristic impedance of the wiring pattern per each section of the wiring pattern 6 is obtained from the following formula (2):

(characteristic impedance)=(increased coefficient)×(area of solid pattern removed area (mm$^2$) for the section)×(offset value)     (2)

There, the "increased coefficient" is the increased coefficient of any one of the characteristics (A), (B) and (C) depicted in FIG. 12. The "area of solid pattern removed area (mm$^2$)" is "area of solid pattern removed area (mm$^2$)" depicted in FIG. 14 and FIG. 16. The "offset value" is determined as 50Ω.

As the solid pattern removed area 8A exists on one side of the wiring pattern 6B as depicted in FIG. 14 and FIG. 16, the characteristic (C) of FIG. 12 is used (increased coefficient=2/0.5=4, according to FIG. 12): 52Ω (i.e., 4×0.5+50=52) for X=28.5 through 29.0; 52Ω for X=29.0 through 29.5; 52Ω for X=29.5 through 30.0; 52Ω for X=30.0 through 30.5; 52Ω for X=30.5 through 31.0; 51Ω (i.e., 4×0.25+50=51) for X=31.0 through 31.5, as depicted as "impedance" in FIG. 16.

Thus, the characteristic impedance of the wiring pattern 6 for each section is obtained.

The degradation degree calculating part 215 carries out the above-mentioned process from the start point to the end point of the wiring pattern 6, the values of the respective sections are integrated together, and the characteristic impedance of the wiring pattern 6 from the start point to the end point is obtained. After that, the degradation degree calculating part 215 calculates a difference (shift) of the characteristic impedance of the wiring pattern 6 from the target value (50Ω).

Next, a method of calculating for assisting in wiring design of a printed circuit board by the wiring design assisting apparatus in the embodiment 1 will be described. Below, description will be made under the condition in which the wiring design assisting program for causing the computer system 10 depicted in FIG. 1 to act as the wiring design assisting apparatus having the function of calculating for assisting in wiring design of a printed circuit board is stored in the HDD 24 depicted in FIG. 2.

Figure 17:
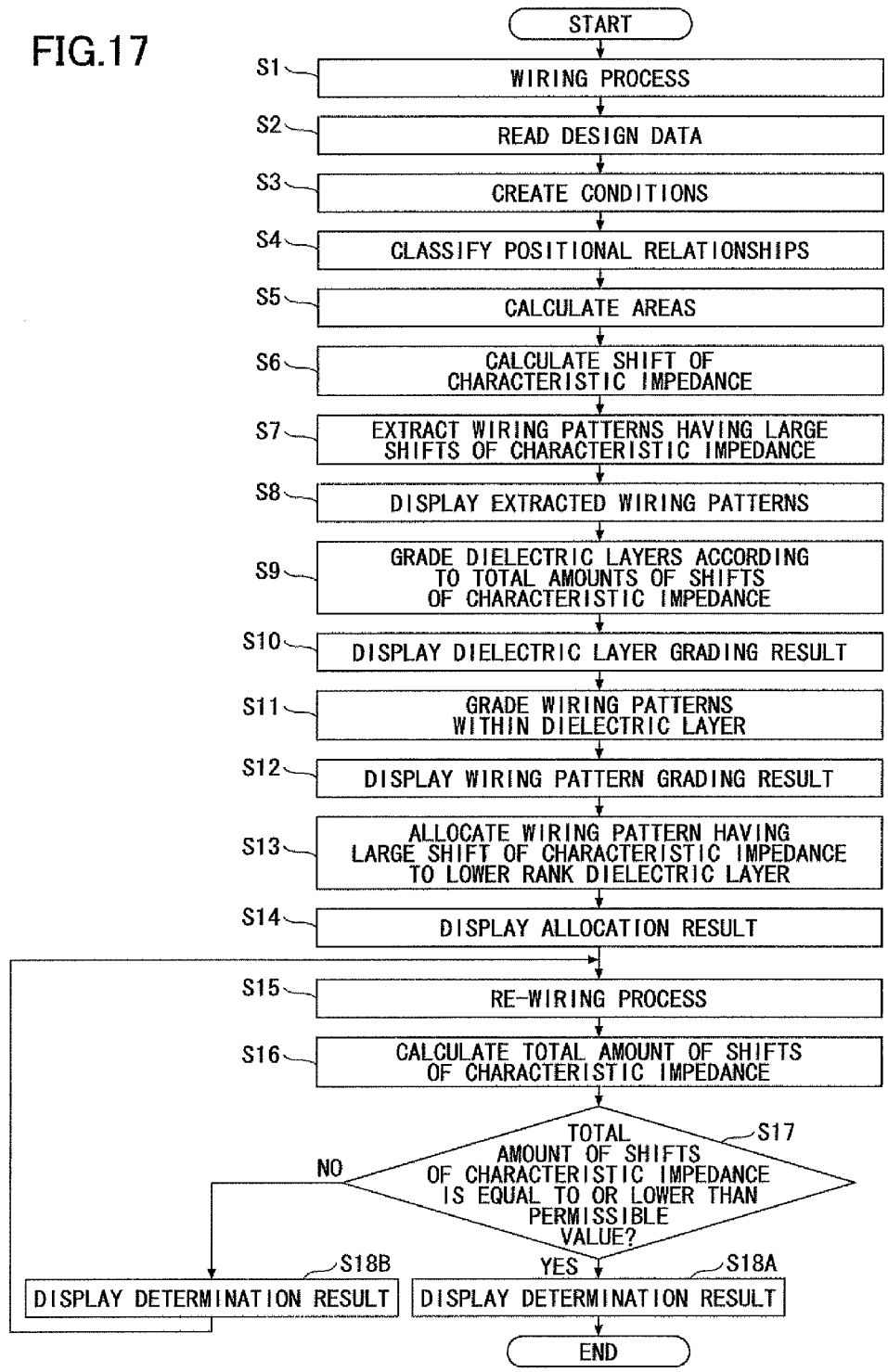
FIG. 17 depicts a flowchart of a calculating process for assisting in wiring design of a printed circuit board in the wiring design assisting apparatus in the embodiment 1.

FIG. 17 depicts a flowchart indicating calculation for assisting in wiring design of a printed circuit board by the wiring design assisting apparatus in the embodiment 1. The calculation depicted in FIG. 17 is performed as a result of the CPU 21 executing the wiring design assisting program in the embodiment 1.

When starting the calculation, the CPU 21 first carries out automatic wiring of wiring patterns 6, solid patterns 7, solid pattern removed areas 8, devices mounted on a printed circuit board 5, and so forth (step S1). By a process of step S1, CAD data depicted in FIGS. 5A and 5B is created. The created CAD data is then stored in the HDD 24 by the management part 222. It is noted that, the process of step S1 is carried out by the wiring process part 210 of the CPU 21.

The CPU 21 reads the CAD data stored in the HDD (step S2). That is, the design data reading part 211 of the CPU 21 reads the CAD data depicted in FIGS. 5A and 5B.

Next, the CPU 21 creates conditions for calculating characteristic impedance degradation degrees (step S3). That is, based on conditions input via the keyboard 13 or the mouse 14, the conditions for calculating the characteristic impedance degradation degrees are created by the condition creating part 212 of the CPU 21. As the conditions thus input, for example, a signal type of a signal transmitted by a wiring pattern 6, a range in a width direction for calculating the characteristic impedance degradation degrees, a threshold for impedance used when extracting is carried out for grading, and so forth, may be cited.

Next, the CPU 21 classifies positional relationships of solid pattern removed areas 8 with respect to wiring patterns 6 in a plan view manner, and creates data indicating the classification result (step S4). That is, the solid pattern removed area detecting part 213 of the CPU 21 creates data indicated by the classification table of FIG. 11 based on X coordinates and Y coordinates of the wiring patterns 6 depicted in FIG. 5A, and X coordinates and Y coordinates of the solid pattern removed areas 8 depicted in FIG. 5B.

The CPU 21 extracts wiring patterns 6 for which calculation is carried out according to a signal type of a signal transmitted by the wiring patterns 6 created by the condition creating part 212, and calculates an area of a solid pattern removed area that exists in the plan view manner within the range in the width direction for which the characteristic impedance degradation degrees (i.e., the area of solid pattern removed area (mm²) depicted in FIG. 14 and FIG. 16 in the embodiment) are calculated (step S5). This process is carried out by the area calculating part 214 of the CPU 21.

Next, the CPU 21 calculates the characteristic impedance degradation degrees of the wiring patterns 6 for which calculation is carried out based on the positional relationships between the wiring patterns 6 and the solid pattern removed areas 8 classified by the solid pattern removed area detecting part 213, and the areas of the solid pattern removed areas calculated by the area calculating part 214 (step S6). This process is carried out by the degradation degree calculating part 215 of the CPU 21, and a shift of the characteristic impedance is calculated as the characteristic impedance degradation degree.

The CPU 21 extracts wiring patterns 6 having the shifts of characteristic impedance equal to or more than a predetermined degree from among the plural wiring patterns 6 for which the degradation degree calculating part 215 calculates the shifts of characteristic impedance (step S7). This process is carried out by the extracting process part 216 of the CPU 21.

Data indicating layer numbers, wiring numbers, and the shifts of characteristic impedance of the extracted wiring patterns 6, is as depicted in FIG. 7.

The CPU 21 displays the data (see FIG. 7) indicating the layer numbers, the wiring numbers and the shifts of characteristic impedance of the wiring patterns 6 extracted by the extracting process part 216, on the display screen 12A of the display 12 depicted in FIG. 1 (step S8). This display process is carried out by the process result display part 221 of the CPU 21.

Next, the CPU 21 calculates a total amount of amounts indicating the shifts of characteristic impedance obtained by the degradation degree calculating part 215 for each of the dielectric layers 5a, 5c and 5e, and grades the dielectric layers 5a, 5c and 5e according to the total amounts in a descending order (step S9). The grading is carried out by the layer grading process part 217 of the CPU 21, and, as depicted in FIG. 8, data indicating the layer numbers graded according to the total amounts of the amounts of the shifts of characteristic impedance for the respective dielectric layers is created. A result depicted in FIG. 8 indicates that such a result is obtained that the dielectric layer 5c at the first place having the layer number 3 has the largest total amount of the amounts of the shifts of characteristic impedance, and the dielectric layer 5a at the third place having the layer number 1 has the smallest total amount of the amounts of the shifts of characteristic impedance.

The CPU 21 displays, on the display screen 12A of the display 12 depicted in FIG. 1, data indicating the layer numbers graded according to the total amounts of the amounts of the shifts of characteristic impedance of the respective dielectric layers by the layer grading process part 217 (step S10). This display process is carried out by the process result display part 221 of the CPU 21.

Next, the CPU 21 grades the wiring patterns having the identifiers No. 4 through No. 6 existing in the dielectric layer graded at the highest place (in the example of FIG. 8, the third dielectric layer 5c from the top, indicated as "3" of "layer" in FIG. 8) in step S10 according to the amounts of the shifts of characteristic impedance in a descending order (step S11). This process is carried out by the wiring grading process part 218 of the CPU 21, and, as depicted in FIG. 9, data is created in which the wiring patterns of the identifiers No. 4 through No. 6 existing in the third dielectric layer 5c are graded according to the amounts of the shifts of characteristic impedance in the descending order.

The CPU 21 displays data indicating the identifiers No. 4 through No. 6 of the wiring patterns graded by the wiring grading part 218 and the amounts of the shifts of characteristic impedance on the display screen 12A of the display 12 depicted in FIG. 1 (step S12). This display process is carried out by the process result display part 221 of the CPU 21.

Next, the CPU 21 extracts the wiring pattern of the identifier No. 4 having the shift of characteristic impedance more than a predetermined value (in the example, 5Ω) from among the wiring patterns (No. 4 through No. 6) graded by the wiring grading process part 218, and allocates the extracted wiring pattern (No. 4) to the highest dielectric layer 5a graded at the lowest rank in step S9 (step S13). This process is carried out by the allocating process part 219 of the CPU 21. Because the predetermined value for extracting the wiring pattern 6 is determined as 5Ω, the wiring pattern of the identifier No. 4 on the third dielectric layer 5c is allocated to the highest dielectric layer 5a.

In step S13, the allocating process part 219 creates data in which, as depicted in FIG. 10, the wiring pattern of the identifier No. 4 is associated with the current layer number and the layer number to which the wiring pattern is allocated. The data depicted in FIG. 10 is displayed on the display screen 12A of the display 12 depicted in FIG. 1 by the process result display part 221 of the CPU 21 (step S14).

Next, the CPU 21 executes a re-wiring process, by using the data indicating the allocation result created by the allocating process part 219, for the wiring pattern of the identifier No. 4 which is a target of the re-wiring process (step S15). This process is carried out by the wiring process part 210 of the CPU 21. By the process of step S15, wiring with the wiring pattern of the identifier No. 4 of the dielectric layer 5c is then carried out in the dielectric layer 5a. The CAD data thus obtained after the re-wiring is stored in the HDD 24. It is noted that, in the subsequent step S17, success or failure of a result of the re-wiring is determined. Therefore, in a case of failure, the CAD data before the re-wiring is used. Therefore, the CAD data (see FIGS. 5A and 5B) before the re-wiring is also stored in the HDD 24.

Next, the CPU 21 calculates a total amount of amounts of shifts of characteristic impedance for each of the dielectric layer 5c from which the wiring pattern having the large shift of characteristic impedance (in the example, the wiring pattern of the identifier No. 4) has been removed by the re-wiring process and the dielectric layer 5a that has thus received the wiring pattern of the identifier No. 4 from the dielectric layer 5c (step S16).

The process of step S16 will now be described with reference to a flowchart of FIG. 18.

Figure 18:
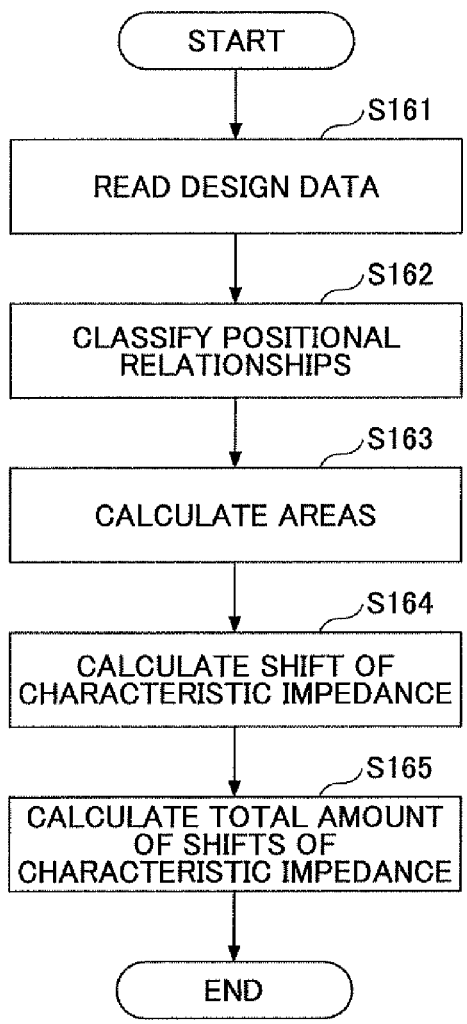
FIG. 18 depicts a flowchart of details of step S16 of the calculating process for assisting in wiring design of a printed circuit board in the wiring design assisting apparatus in the embodiment 1.

FIG. 18 depicts a flowchart indicating details of step S16 in calculating for assisting in wiring design of a printed circuit board by the wiring design assisting apparatus in the embodiment 1.

The CPU 21 reads the CAD data obtained after the re-wiring stored in the HDD 24 (step S161). This process is carried out by the design data reading part 211 of the CPU 21, the same as in step S2, and the CAD data of the wiring pattern of the identifier No. 4 with which the re-wiring is carried out in the dielectric layer 5a is read.

Next, the CPU 21 classifies positional relationships of solid pattern removed areas 8 with respect to the wiring pattern of the identifier No. 4 after the re-wiring in a plan view manner, and creates data indicating a classification result (step S162). This process is a process of creating data such as the classification table of FIG. 11 based on X coordinates and Y coordinates of the wiring pattern of the identifier No. 4 after the re-wiring, and X-coordinates and Y coordinates of solid pattern removed areas 8 depicted in FIG. 5B, and, the same as in step S4, is carried out by the solid pattern removed area detecting part 213 of the CPU 21.

The CPU 21 calculates, for the wiring pattern of the identifier No. 4, an area of the solid pattern removed area 8 existing within a range in a width direction for which a characteristic impedance degradation degree is calculated in a plan view manner (step S163). This process is, the same as in step S5, carried out by the area calculating part 214 of the CPU 21.

As the range in the width direction for which a characteristic impedance degradation degree is calculated, the range determined in step S3 is used.

Next, the CPU 21 calculates a characteristic impedance degradation degree in the wiring pattern of the identifier No. 4 after the re-wiring, by using the positional relationships between the wiring pattern of the identifier No. 4 after the re-wiring and the solid pattern removed areas 8 classified by the solid pattern removed area detecting part 213, and the area of the solid pattern removed area 8 calculated by the area calculating part 214 (step S164). This process is carried out, as in step S6, by the degradation degree calculating part 215, and, a shift of characteristic impedance is calculated as the characteristic impedance degradation degree.

The CPU 21 calculates a total amount of amounts of shifts of characteristic impedance for each of the dielectric layer 5c from which the wiring pattern of the identifier No. 4 has been removed by the re-wiring process and the dielectric layer 5a that has received the wiring pattern of the identifier No. 4 from the dielectric layer 5c, by using the value indicating the shift of characteristic impedance of the wiring pattern of the identifier No. 4 calculated in step S164 (step S165). This process is carried out by the degradation degree calculating part 220 of the CPU 21.

For the dielectric layer 5c from which the wiring pattern of the identifier No. 4 has been removed, the amount of the shift of characteristic impedance of the wiring pattern of the identifier No. 4 after the re-wiring calculated in step S164 is subtracted from the total amount of shifts of characteristic impedance calculated in step S9 before the re-wiring. Thus, the total amount of the shifts of characteristic impedance in the dielectric layer 5c after the re-wiring is calculated.

For the dielectric layer 5a that has received the wiring pattern of the identifier No. 4 from the dielectric layer 5c, the amount of the shift of characteristic impedance of the wiring pattern of the identifier No. 4 after the re-wiring calculated in step S164 is added to the total amount of shifts of characteristic impedance calculated in step S9 before the re-wiring. Thus, the total amount of the shifts of characteristic impedance in the dielectric layer 5a after the re-wiring is calculated.

It is noted that, the process of step S16 may be such that, a total amount of shifts of characteristic impedance of the wiring patterns 6 after the re-wiring is calculated for each of the dielectric layers 5a and 5c, after processes of steps S2 through S6 that have been carried out before the re-wiring, are carried out again for the entirety of the wiring patterns 6 of the dielectric layers 5a and 5c after the re-wiring.

Thus, the series of processes of FIG. 18 have been finished, and thus, the process of step S16 of FIG. 17 is finished.

The CPU 21 determines whether the total amount of shifts of characteristic impedance in each of the dielectric layers 5a and 5c is equal to or less than a predetermined permissible value (step S17). This process is carried out by the degradation degree determining part 220 of the CPU 21.

It is assumed that the predetermined permissible value in step S17 is 15Ω, for example.

In a case where the CPU 21 determines that each of both the total amounts of shifts of characteristic impedance of the wiring patterns 6 in the respective dielectric layers 5a and 5c calculated in step S16 is equal to or less than the predetermined permissible value, the CPU 21 displays that a result of the re-wring is success (step S18A).

On the other hand, in a case where the CPU 21 determines that at least any one of the total amounts of shifts of characteristic impedance of the wiring patterns 6 in the respective dielectric layers 5a and 5c calculated in step S16 is larger than the predetermined permissible value, the CPU 21 displays that a result of the re-wring is failure (step S18B).

After carrying out the display that the result of the re-wiring is failure in step S18B, the CPU 21 returns the flow to step S15, and again carries out a re-writing process.

Thus, the series of processes carried out by the CPU 21 is finished.

Thus, by the wiring design assisting apparatus in the embodiment 1, an area of a solid pattern removed area 8 is calculated by using CAD data, and a characteristic impedance degradation degree is calculated. As a result, in a printed circuit board 5 in which high-density mounting is carried out, it is possible to identify a wiring pattern 6 having a large characteristic impedance degradation degree, from among wiring patterns having high levels of importance included in a huge number of wiring patterns 6, by selecting wiring patterns 6 which transmit signals having high levels of importance or such. The wiring patterns 6 having the high levels of importance can be selected by using the attributes of the wiring patterns 6 (for example, signal types (signal names) of signals transmitted by the wiring patterns 6).

Thus, it is possible to select a specific wiring pattern 6 and determine a characteristic impedance degradation degree. Therefore, calculation may not be carried out for all the wiring patterns 6, and thus, it is possible to reduce the number of processes during a stage in which the wiring patterns are designed.

Further, recently, because process speed increases in electronic apparatuses, an influence of a very small solid pattern removed area on signal characteristics may not be ignored. According to the wiring design assisting apparatus in the embodiment 1, it is possible to calculate characteristic impedance degradation degrees in consideration of very small solid pattern removed areas (pattern removed areas) or such by using CAD data. Therefore, the wiring design assisting apparatus in the embodiment 1 can assist, especially in wiring design of a printed circuit board 5 that processes high-speed (high-rate) signals, so that a designer can carry out wiring design in which signal characteristics are satisfactory in consideration of very small pattern removed areas.

It is noted that a re-wiring process of a wiring pattern 6 may be carried out throughout from a start point to an end point, or may be carried out only for a part of the wiring pattern 6, which part has a large characteristic impedance degradation degree.

Further, a simulation for obtaining signal characteristics may be carried out on a printed circuit board 5 on which a re-wiring process has been carried out, and a result of the re-wiring process may be determined based on a result of the simulation. For example, an eye pattern may be generated by using characteristic impedance of a wiring pattern 6 after the re-wiring process, and it may be determined based on a waveform of the eye pattern whether the re-wiring process is permissible.

In the above description, a mode has been described in which, the extracting process part 216 extracts wiring patterns 6 having shifts of characteristic impedance equal to or more than the predetermined value, then, the dielectric layers 5a, 5c and 5e are graded, the wiring patterns 6 in the dielectric layer (any of 5a, 5c and 5e) are graded, the wiring pattern 6 is allocated, and then, a re-wiring process is automatically carried out.

However, in the wiring design assisting apparatus in the embodiment 1, an extraction result (see FIG. 7) of wiring patterns 6 extracted by the extracting process part 216 for carrying out a re-wiring process is displayed on the display screen 12A of the display 12. Therefore, at this time, the designer may see the extraction result depicted in FIG. 7, and manually determine a position to carry out a re-wiring process.

That is, the processes carried out by the layer grading process part 217, the wiring grading process part 218, the allocating process part 219 and the degradation degree determining part 220 may not be carried out in the wiring design assisting apparatus in the embodiment 1, and the wiring design assisting apparatus in the embodiment 1 may have a simple configuration such that the designer uses only the extraction result of the extracting process part 216.

The designer sees the display screen 12A of the display 12, and may identify wiring patterns 6 by identifiers and layer numbers having relatively larger shifts of characteristic impedance from among wiring patterns 6 having specific signal names from among a huge number of wiring patterns 6. Therefore, the designer may carry out re-wiring of the wiring pattern 6 that the designer himself or herself selects to a position that the designer determines preferable. Also in such a simple configuration, the wiring design assisting apparatus in the embodiment 1 can assist the designer who carries out wiring design.

It is noted that the value indicating the shift of characteristic impedance used when the extracting process part 216 extracts the wiring patterns 6 may be determined to be any value as a result of the designer operating the keyboard 13 or the mouse 14. The determined value is used in the condition creating part 212 as the extracting condition.

Further, similarly, the wiring design assisting apparatus in the embodiment 1 may have a configuration such that any process or processes may be selected from among the processes carried out by the layer grading process part 217, the wiring grading process part 218, the allocating process part 219 and the degradation degree determining part 220.

When a process carried out by each process part is finished, the process result display part 221 displays a process result on the display screen 12A of the display 12. Therefore, such a configuration may be provided so that, at a time when any process is finished, the designer himself or herself may carry out a subsequent process or processes according to his or her own determination.

Similarly, re-wiring may be carried out, not by the wiring process part 210, but by the designer himself or herself, and the designer may carry out re-wiring of the wiring pattern 6 that the designer himself or herself selects to a position that the designer himself or herself determines preferable.

It is noted that the contents of processes carried out in the wiring design assisting apparatus in the embodiment 1 may be partially changed as will be described now, for example.

Figure 19A:
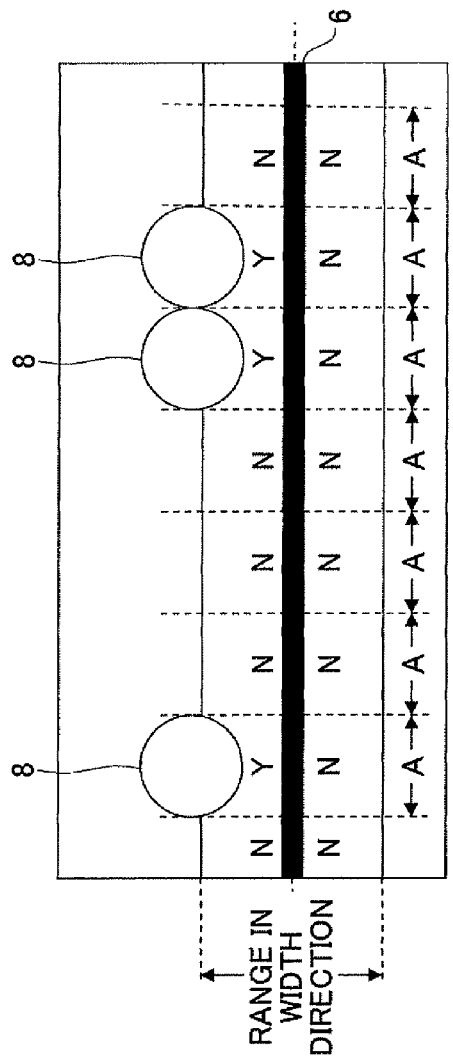
FIGS. 19A and 19B illustrate another method of calculating an area of a solid pattern removed area 8 in the wiring design assisting apparatus in the embodiment 1.
Figure 19B:
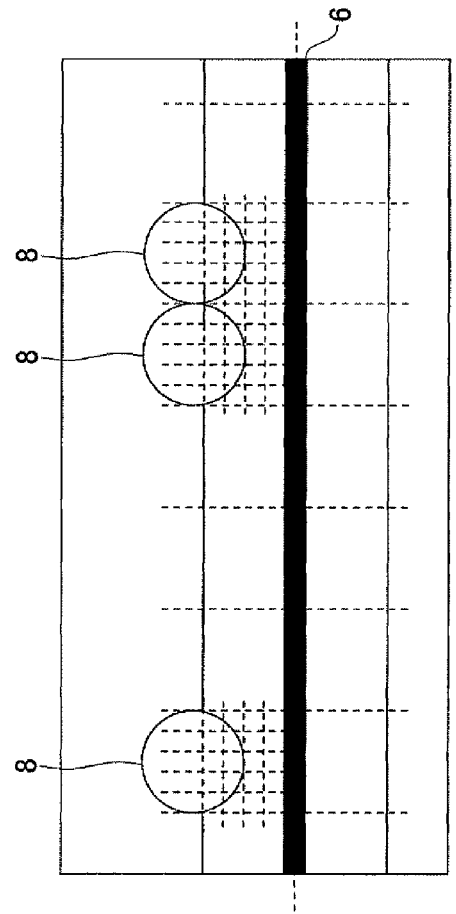

FIGS. 19A, 19B illustrate another method of calculating an area of a solid pattern removed area 8 in the wiring design assisting apparatus in the embodiment 1.

In the above description, the solid pattern removed area 8 existing within the range in the width direction is divided into meshes from the start point to the end point of the wiring pattern 6, and the characteristic impedance degradation degree is obtained for each unit area (mesh). However, as depicted in FIG. 19A, before being divided into meshes, the wiring pattern 6 may be divided into plural sections each having a predetermined length A. Then, after it is determined whether each section of the plural sections includes the solid pattern removed area 8, dividing into meshes may be carried out as depicted in FIG. 19B only for the section for which the solid pattern removed area 8 exists ("Y"), and the characteristic impedance degradation degree may be calculated for each unit area (mesh).

Further, in the above description, a mode has been described such that the total amount of shifts of characteristic impedance is calculated for each of the dielectric layers, and the wiring pattern 6 for which re-wiring is carried out is allocated to the dielectric layer having the lowest total amount. However, a method of determining the dielectric layer to which re-wiring of the wiring pattern 6 is carried out is not limited to this method. For example, from the CAD data read by the design data reading part 211, an existing ratio of the wiring patterns 6 (for example, a ratio of an area of the wiring patterns 6 with respect to the area of the dielectric layer) is obtained for each of the dielectric layers, and the dielectric layer having the relatively low existing rate may be determined to which the wiring pattern 6 for which re-wiring is carried out is allocated.

Figure 20:
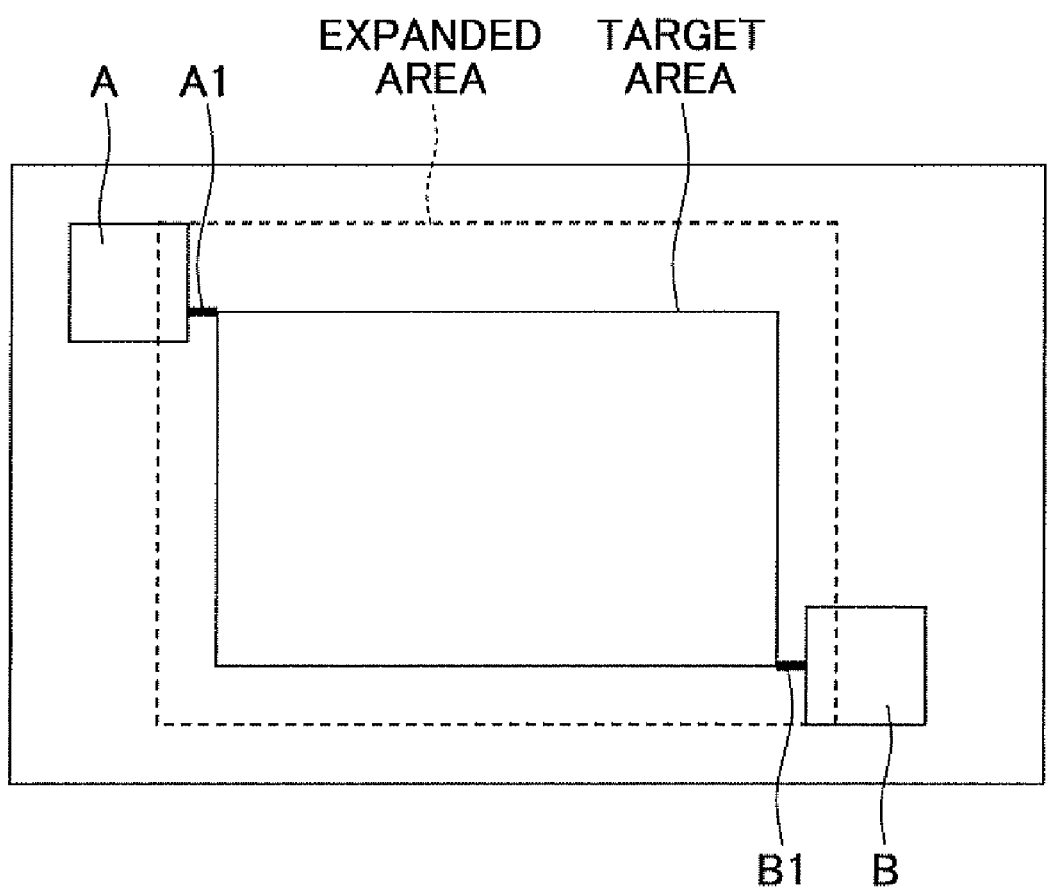
FIG. 20 depicts an area for which automatic wiring is carried out in the wiring design assisting apparatus in the embodiment 1.

FIG. 20 depicts an area in which automatic wiring is carried out in the wiring design assisting apparatus in the embodiment 1.

Normally, when automatic wiring is carried out between a device A and a device B by a wiring pattern 6, a wiring process is carried out by using an area (a "target area" depicted in FIG. 20) defined by a rectangle having a coordinate of a terminal A1 of the device A and a coordinate of a terminal B1 of the device B as respective vertexes on a diagonal. However, in a case where a high-density mounting is carried out, there is a case where wiring having satisfactory impedance may not be carried out only within the target area. In such a case, the target area may be expanded in a predetermined ratio into an expanded area, and automatic wiring may be carried out in the expanded area indicated by a broken line in FIG. 20. Also a re-wiring process may be carried out in the same way. The above-mentioned predetermined ratio in which the target area is expanded is determined as 10%, for example.

Embodiment 2

In the embodiment 1 described above, a degradation degree in signal characteristics is calculated as a result of a characteristic impedance degradation degree being calculated. A wiring design assisting apparatus in an embodiment 2 is different from the embodiment 1 in that, when a degradation degree in signal characteristics is calculated, a degradation degree in signal characteristics caused by crosstalk is calculated.

As depicted in FIG. 4 for describing the embodiment 1, in a case where the wiring patterns 6B and the solid pattern removed areas 8A and 8B are close together, when the wiring patterns 6B, existing on the dielectric layer 5e that is one layer below the dielectric layer 5d in which the solid pattern removed areas 8A and 8B are formed, is near to the solid pattern removed areas 8A and 8B, crosstalk may occur between wiring patterns via the solid pattern removed areas 8A and 8B. Crosstalk causes degradation in signal characteristics.

Figure 21:
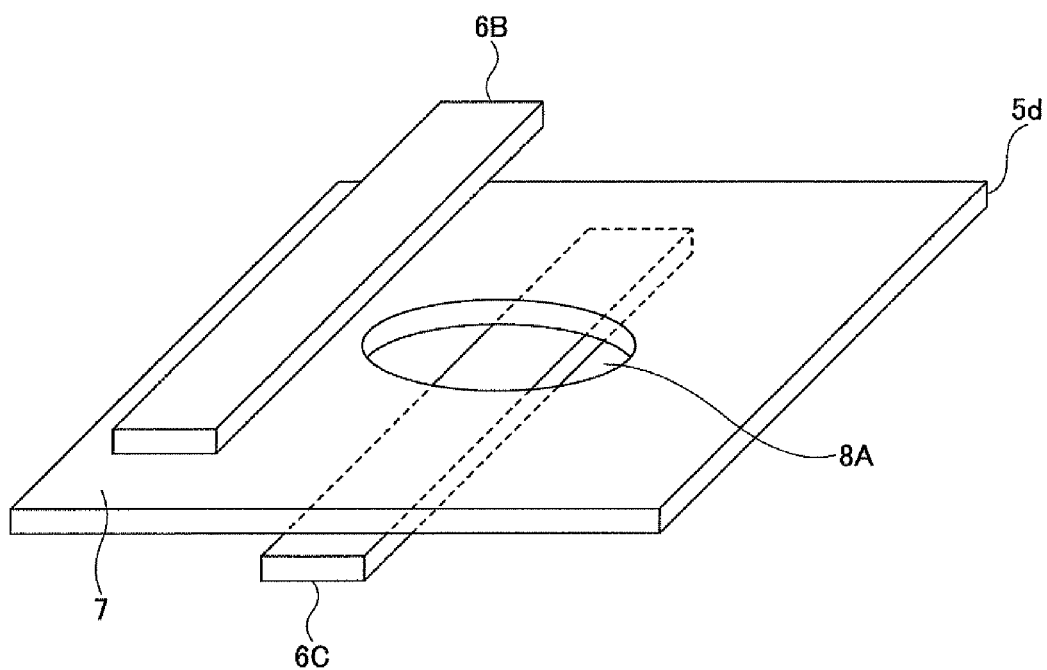
FIG. 21 depicts a perspective view of one example of positional relationships between wiring patterns 6B, 6C and a solid pattern removed area 8A.

FIG. 21 is a perspective view depicting one example of a positional relationship between wiring patterns 6B and 6C and a solid pattern removed area 8A. The wiring pattern 6B is formed on a third dielectric layer 5c, the solid pattern removed area 8A is formed as an opening in a solid pattern 7 formed on a fourth dielectric layer 5d, and the wiring pattern 6C is formed on a fifth dielectric layer 5e. However, for the sake of convenience in explanation, the dielectric layers 5c through 5e are omitted in FIG. 21.

Further, although actually a signal via or a GND via is formed through the solid pattern removed area 8A, such a signal via or a GND via is omitted in FIG. 21 for the sake of convenience in explanation.

Figure 22:
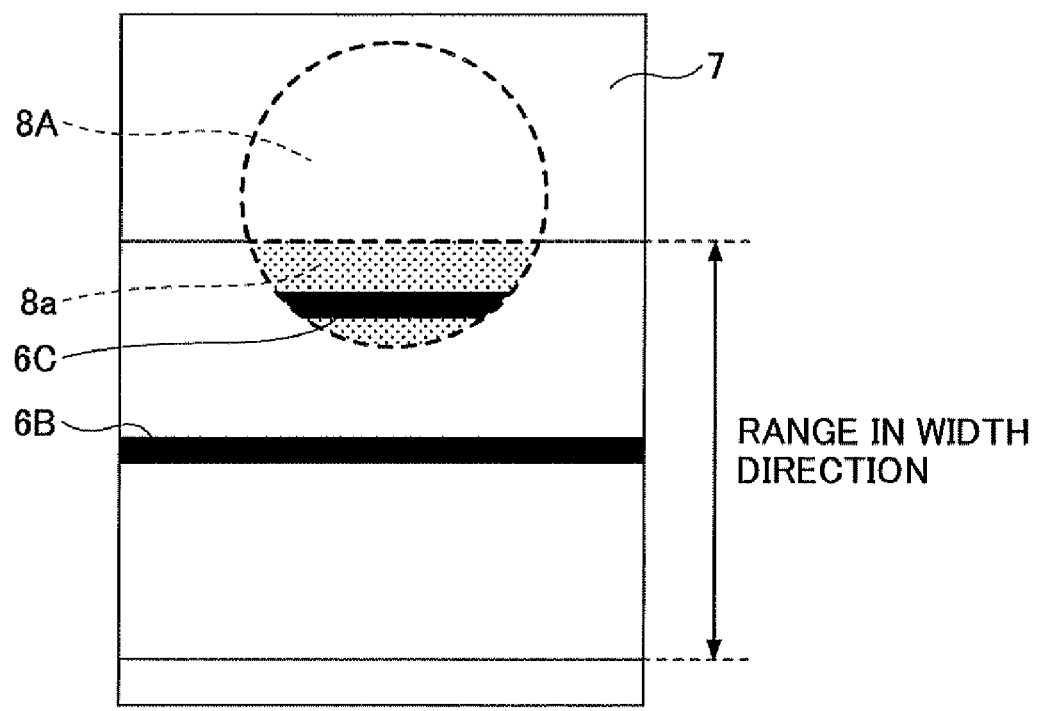
FIG. 22 depicts the positional relationships between the wiring patterns 6B, 6C and the solid pattern removed area 8A depicted in FIG. 21 in a plan view manner.

FIG. 22 depicts positional relationships between the wiring patterns 6B, 6C and the solid pattern removed area 8A depicted in FIG. 21 in the plan view manner. In a case of the positional relationships depicted in FIG. 21, the wiring pattern 6C is located immediately below the solid pattern removed area 8A in the plan view manner as depicted in FIG. 22.

In the wiring design assisting apparatus in the embodiment 2, an area of a crosstalk area is calculated, the calculated area is multiplied by a coefficient for obtaining noise caused by crosstalk, and thus a wiring pattern for which re-wiring is carried out is extracted.

The crosstalk area means an area by which the wiring pattern 6C overlaps an area 8a of the solid pattern removed area 8A in a plan view manner which area 8a (filled with halftone dots in FIG. 22) exists within a range in a width direction of the wiring pattern 6B. That is, the crosstalk area means an area by which, within the range in the width direction of the wiring pattern 6B, the solid pattern removed area 8B overlaps the wiring pattern 6C. In the case of FIG. 22, an area of the part of the wiring pattern 6C which part can be seen through the solid pattern removed area 8A as depicted in FIG. 22 is the crosstalk area.

Figure 23:
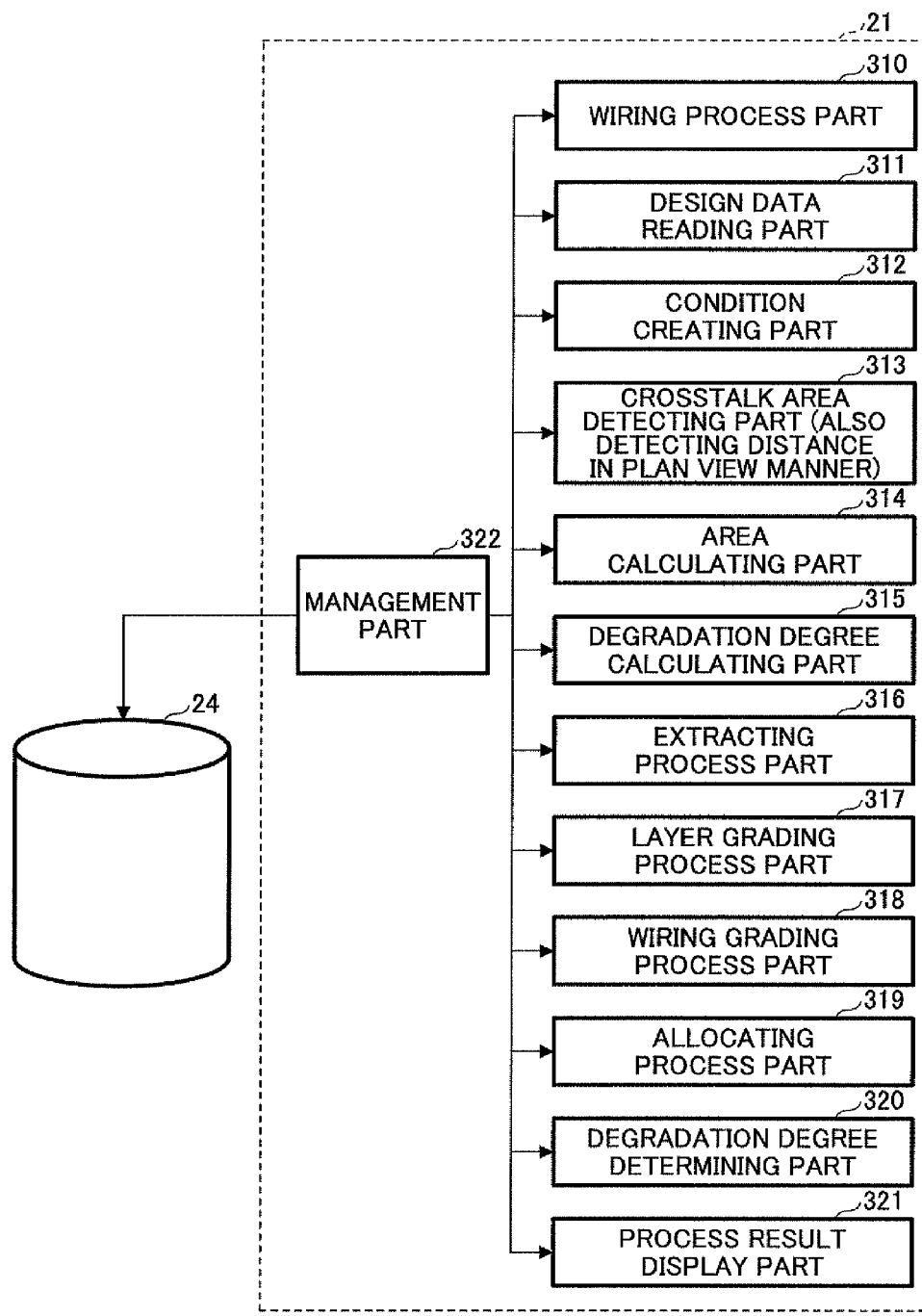
FIG. 23 depicts a block diagram of functions of a wiring design assisting apparatus in an embodiment 2.

FIG. 23 is a block diagram depicting functions of the wiring design assisting apparatus in the embodiment 2. The functional block of FIG. 23 is realized as a result of the CPU 21 depicted in FIG. 2 executing a wiring design assisting program stored in the HDD 24.

The functional block realized by the CPU 21 includes a wiring process part 310, a design data reading part 311, a condition creating part 312, a crosstalk area detecting part 313, an area calculating part 314, a degradation degree calculating part 315, an extracting process part 316, a layer grading process part 317, a wiring grading process part 318, an allocating process part 319, a degradation degree determining part 320, a process result display part 321 and a management part 322. Below, mainly points in the embodiment 2 different from the embodiment 1 will be described.

The wiring process part 310 and the design data reading part 311 carry out the same processes as those the wiring process part 210 and the design data reading part 211 in the embodiment 1 carry out, respectively.

The condition creating part 312 creates conditions used for calculating a degradation degree in signal characteristics caused by crosstalk described later, based on conditions input via the keyboard 13 or the mouse 14. As the conditions thus input, for example, signal types of signals transmitted by wiring patterns 6, a range in a width direction used for calculating the degradation degree in signal characteristics caused by crosstalk, a length of a side of a mesh used for calculating an area of a crosstalk area, an extracting condition used for extracting wiring patterns 6 (for example, a value indicating intensity of crosstalk), a threshold of intensity of crosstalk used for extracting for grading, or such, may be cited.

The crosstalk area detecting part 313 classifies positional relationships between a solid pattern removed area 8 with respect to a wiring pattern 6 in the plan view manner and another wiring pattern 6 that is seen through the solid pattern removed area 8 in the plan view manner, based on X coordinates and Y coordinates of the wiring patterns 6 depicted in FIG. 5A and an X coordinate and a Y coordinate of the solid pattern removed area 8 depicted in FIG. 5B.

The area calculating part 314 extracts wiring patterns 6 for which calculation is carried out according to signal types (signal names) of signals transmitted by the wiring patterns 6 created by the condition creating part 312, and calculates an area of a crosstalk area existing within the range in the width direction used for calculating intensity of crosstalk. As described above, the crosstalk area means an area by which, within the range in the width direction of the wiring pattern 6, the solid pattern removed area 8 and the other wiring pattern 6 overlap together. Therefore, a degradation degree in signal characteristics in the wiring design assisting apparatus in the embodiment 2 is calculated by using an area of the solid pattern removed area 8.

The degradation degree calculating part 315 calculates intensity of crosstalk as a degradation degree in signal characteristics in the wiring pattern 6 for which calculation is carried out, by using the positional relationships between the wiring pattern 6, the solid pattern removed area 8 and the other wiring pattern, classified by the crosstalk area detecting part 313, and the area of the crosstalk area calculated by the area calculating part 314.

The extracting process part 316 extracts wiring patterns 6 having crosstalk intensity (intensity of crosstalk) equal to or more than predetermined intensity, to be used in re-wiring, from among plural wiring patterns 6 for which crosstalk intensity is obtained by the degradation degree calculating part 315. Identifiers (Nos.) of the extracted wiring patterns 6 are displayed on the display screen 12A of the display 12 by the process result display part 321, the same as for the extraction result in the embodiment 1.

The layer grading process part 317 calculates, for each of the dielectric layers 5a, 5c and 5e, an extraction degree that indicates a degree in which the degradation degree calculating part 315 extracts the wiring patterns 6, and grades the respective dielectric layers 5a, 5c and 5e according to the extraction degrees of the wiring patterns 6. The layer grading process part 317 acts as an extraction degree process part that obtains an extraction degree for each of the dielectric layers 5a, 5c and 5e, and calculates, as the extraction degree, a total amount of crosstalk intensity in each of the dielectric layers 5a, 5c and 5e. The total amount of crosstalk intensity in each of the dielectric layers 5a, 5c and 5e is displayed on the display screen 12A of the display 12 by the process result display part 321 together with the corresponding layer number, the same as for the process result of the layer grading process part 217 in the embodiment 1.

The wiring grading process part 318 creates data in which the wiring patterns 6, that exist in the dielectric layer (any of 5a, 5c and 5e) determined as having the largest total amount of crosstalk intensity by the layer grading process part 317, are graded according to the crosstalk intensity in a descending order. A result of the grading is displayed on the display screen 12A of the display 12 by the process result display part 321 together with the corresponding identifiers (Nos.) of the wiring patterns 6, the same as for the process result of the wiring grading process part 218 in the embodiment 1.

The allocating process part 319 allocates the wiring pattern 6 that has the largest crosstalk intensity according to the grading carried out by the wiring grading process part 318 to the dielectric layer (any of 5a, 5c and 5e) which is determined as having the smallest total amount of crosstalk intensity by the layer grading process part 317. The allocating process part 319 creates an allocation result that indicates the layer number associated with the identifier (No.) of the corresponding wiring pattern 6, and the layer number of the dielectric layer to which the wiring pattern 6 is thus allocated. The allocation result is displayed on the display screen 12A of the display 12 by the process result display part 321.

It is noted that, when the wiring pattern 6 is thus allocated by the allocating process part 319, the wiring process part 310 carries out a re-wiring process accordingly. After the re-wiring process is thus finished, the degradation degree calculating part 315 again calculates the crosstalk intensity of the wiring patterns that exist in the dielectric layers (any of 5a, 5c and 5e) for which the re-wiring process is thus carried out.

The degradation degree determining part 320 calculate the total amounts of crosstalk intensity of the wiring patterns 6 that exist in the dielectric layers (any of 5a, 5c and 5e) for which the re-wiring has been thus carried out by the wiring process part 310, and determines whether the total amounts are equal to or less than a criterion. A determination result is displayed on the display screen 12A of the display 12 by the process result display part 321.

The process result display part 321 displays, on the display screen 12A of the display 12 depicted in FIG. 1, the identifiers (Nos.) of the wiring patterns 6 thus extracted for re-wiring, the total amount of crosstalk intensity of each of the dielectric layers 5a, 5c and 5e together with the layer number, the results of grading, the identifier (No.) of the wiring pattern 6 for which allocation is thus changed, the current layer number and the layer number to which the wiring pattern 6 is thus allocated, and the determination result of the degradation degree determining part 320.

The management part 322 acts as a data management part that manages storing of data in the HDD 24.

FIG. 24 is a table depicting noise per unit area ("noise per unit area (mV)") for calculating crosstalk intensity per unit area of a crosstalk area in the wiring design assisting apparatus in the embodiment 2.

The table depicting noise for calculating crosstalk intensity of FIG. 24 is used for calculating crosstalk intensity as an index for measuring a degradation degree in signal characteristics, and indicates noise per unit area ("noise per unit area (mV)") for calculating crosstalk intensity per unit area of a crosstalk area with respect to a dielectric constant of dielectric layers ("dielectric constant") and a distance between wiring patterns in a thickness direction. The table depicted in FIG. 24 and a table depicted in FIG. 25 (described later) are one example of degradation degree information indicating a degradation degree in signal characteristics in a wiring pattern 6 with respect to positional relationships of wiring patterns 6 and a solid pattern removed area 8, and a size of the solid pattern removed area 8, and are stored in the HDD 24 as a third database.

FIG. 25 depicts a table of correction coefficients to be used for calculating crosstalk intensity in the wiring design assisting apparatus in the embodiment 2. As depicted in FIG. 25, a specific value of the correction coefficient is determined according to a distance between wiring patterns 6 and a distance between a wiring pattern 6 and a solid pattern removed area 8 ("solid offset (mm)" in FIG. 25).

The distance between wiring patterns 6 in FIG. 25 means a distance between the wiring patterns 6 in a plan view manner, and, for example, a distance between the wiring patterns 6B and 6C depicted in FIG. 22. The distance between a wiring pattern 6 and a solid pattern removed area 8 ("solid offset") means, for example, in a case where the wiring pattern 6B depicted in FIG. 22 is offset (or shifted) from the solid pattern removed area 8A, a distance (offset amount) between the wiring pattern 6B and the solid pattern removed area 8A.

Figure 26:
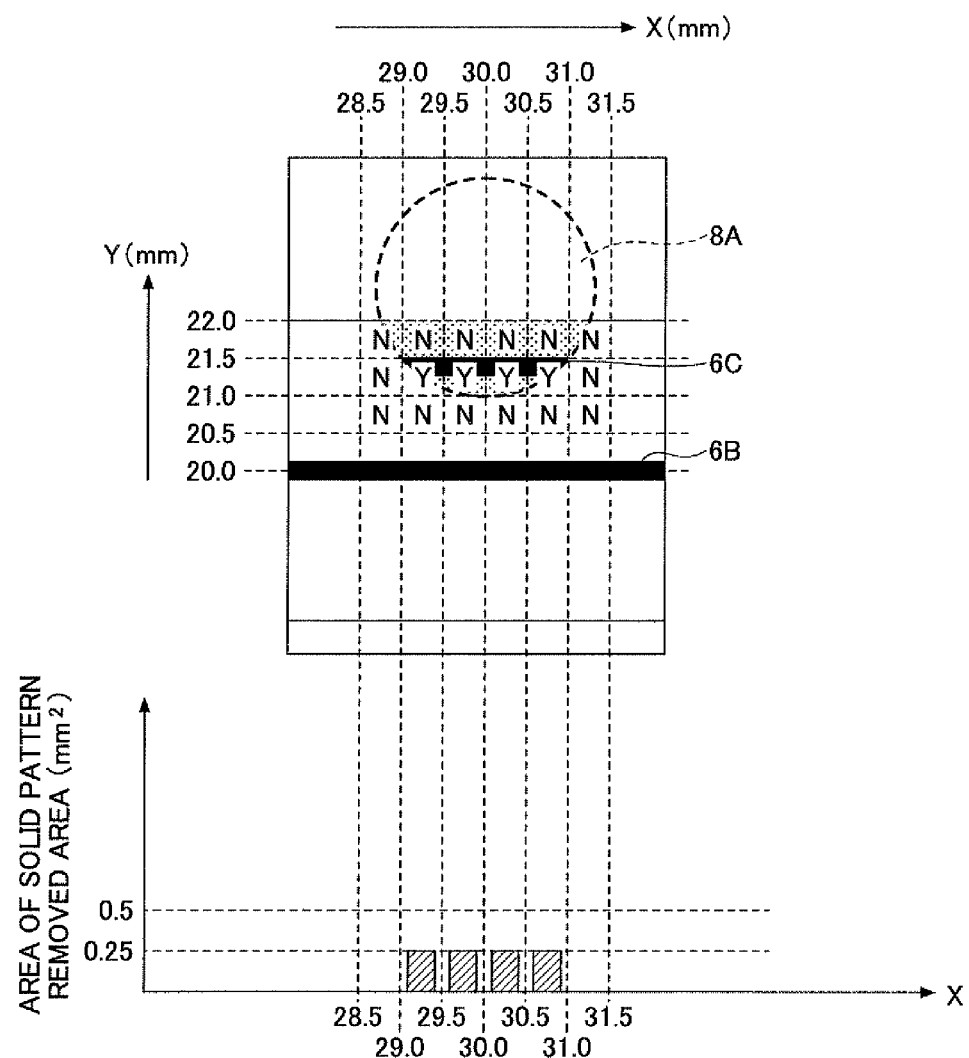
FIG. 26 illustrates a method of calculating an area of a crosstalk area used in calculating intensity of crosstalk in the wiring design assisting apparatus in the embodiment 2.

FIG. 26 illustrates a method of calculating an area of a crosstalk area used for calculating crosstalk intensity in the wiring design assisting apparatus in the embodiment 2.

The area calculating part 314 calculates an area of a crosstalk area as follows: A range for which calculation is carried out is divided into square meshes each having a predetermined area, from a start point to an end point of a wiring pattern 6 for which calculation of a degradation degree in signal characteristics is carried out, and it is determined, for each mesh, whether a solid pattern removed area 8 and a wiring pattern 6 exist.

When a solid pattern removed area 8 and a wiring pattern 6 simultaneously exist at least in a part of a mesh, the mesh is determined as having a crosstalk area. That is, a mesh determined as not having a crosstalk area is a mesh in which a solid pattern removed area 8 and a wiring pattern 6 do not simultaneously exist.

A length of a side of the mesh is determined, for example, by the following formula (3):

(a length of a side of the mesh)=(rise time)×(propagation velocity in transmission path)/(any dividing number) (3)

It is assumed that a length of a side of the mesh is 0.5 mm. Further, as a coordinate of the mesh, the smallest one in a numeric value from among the coordinates of the four corners of the (square) mesh is used. That is, in the example of FIG. 26, the coordinate value of the bottom left vertex is used to identify the mesh.

In the example of FIG. 26, it is determined, for meshes included in a range of X=28.5 through 31.5 and also, a range of Y=20.0 through 22.0, whether they have a crosstalk area. It is noted that, in FIG. 26, "Y" denotes a mesh determined as having a crosstalk area, and "N" denotes a mesh determined as not having a crosstalk area.

In the example of FIG. 26, as depicted in FIG. 22, the part of the wiring pattern 6C which part is seen through the solid pattern removed area 8A is the crosstalk area. Therefore, as a calculation result, the following areas are obtained: 0 mm$^2$ for a section of X=28.5 through 29.0, 0.25 mm$^2$ for a section of X=29.0 through 29.5, 0.25 mm$^2$ for a section of X=29.5 through 30.0, 0.25 mm$^2$ for a section of X=30.0 through 30.5, 0.25 mm$^2$ for a section of X=30.5 through 31.0, 0 mm$^2$ for a section of X=31.0 through 31.5.

FIG. 27 depicts, in a table form, a result of extracting a distance between wiring patterns together with the determination result of FIG. 26.

As depicted in FIG. 27, for the mesh determined as having a crosstalk area ("Y"), a flag "1" is given, while, for the mesh determined as not having a crosstalk area ("N"), a flag "0" is given. The flag is used by the degradation degree calculating part 315 to calculate crosstalk intensity.

The degradation degree calculating part 315 selects a noise amount per unit area ("noise per unit area (mV)") from the table of FIG. 24 by using a dielectric constant of dielectric layers (corresponding to "dielectric constant" in FIG. 24) and a distance between wiring patterns in a thickness direction (corresponding to "distance between wiring patterns in thickness direction (mm)" in FIG. 24) included in the CAD data, and also, selects a correction coefficient from the table of FIG. 25 by using position data included in the CAD data and a result of extracting a distance between wiring patterns for which calculation is carried out (corresponding to "distance between wiring patterns (mm)" in FIG. 25) depicted in FIG. 25, and calculates crosstalk intensity per unit area by using the following formula (4):

$$(\text{crosstalk intensity}) = (\text{noise amount per unit area}) \times (\text{correction coefficient}) \quad (4)$$

The above-mentioned dielectric constant of dielectric layers ("dielectric constant" depicted in the table of FIG. 24) means a dielectric constant of dielectric layers included in a printed circuit board 5 existing between wiring patterns for which calculation is carried out. The distance between wiring patterns in a thickness direction means a distance between wiring patterns for which calculation is carried out in a thickness direction. The thickness direction is a direction perpendicular to a surface of the dielectric layer on which the wiring pattern is formed. In the example of FIG. 21, the dielectric constant of dielectric layers is a dielectric constant of the dielectric layers 5c and 5d existing between the wiring patterns 6B and 6C for which calculation is carried out. The distance between wiring patterns in the thickness direction is a distance between the wiring patterns 6B and 6C in the thickness direction.

Further, in the selecting of the correction coefficient from the table of FIG. 25, the position data of the CAD data that includes data such as that depicted in FIGS. 5A and 5B, for example, is used, and by using the data, the "solid offset" depicted in FIG. 25 is obtained. By using the thus-obtained solid offset, together with the extracted distance between the wiring patterns for which calculation is carried out depicted in FIG. 27, the correction coefficient is extracted from the table of FIG. 25.

The formula (4) is a formula for obtaining crosstalk intensity per unit area of a crosstalk area in consideration of a first factor concerning positional relationships in the thickness direction and a second factor concerning positional relationships obtained in the plan view manner. The table of FIG. 24 provides noise per unit area for calculating crosstalk intensity per unit area of a crosstalk area in consideration of the first factor. The table of FIG. 25 provides a correction coefficient used in the formula (4) to correct, according to the second factor, the noise per unit area obtained in consideration of the first factor obtained from the table of FIG. 24, to obtain crosstalk intensity per unit area of a crosstalk area in consideration of both the first factor and the second factor.

The crosstalk intensity per unit area thus obtained by using the formula (4) by the degradation degree calculating part 315 is integrated from the start point to the end point of the wiring pattern 6, in the same way as that for the characteristic impedance in the embodiment 1, and thus, for each wiring pattern 6, crosstalk intensity is calculated.

The extracting process part 316 determines whether the crosstalk intensity of each wiring pattern is equal to or more than the predetermined intensity, and extracts a wiring pattern 6 having the crosstalk intensity equal to or more than the predetermined intensity to be used in re-wiring.

After that, in the same way as that in the embodiment 1, the layer grading process part 317 carries out a grading process, the wiring grading process part 318 carries out a grading process, and the allocating process part 319 carries out an allocating process, the same as those of the layer grading process part 217, the wiring grading process part 218 and the allocating process part 219 in the embodiment 1. Thus, the wiring pattern having the largest crosstalk intensity included in the dielectric layer having the largest total amount of crosstalk is allocated to the dielectric layer having the smallest total amount of crosstalk intensity.

Thus, by the wiring design assisting apparatus in the embodiment 2, a crosstalk area is calculated by using CAD data, and crosstalk intensity is calculated. As a result, it is possible to identify wiring patterns 6 having a large amount of crosstalk, from among wiring patterns having high levels of importance included in a huge number of wiring patterns 6, by selecting wiring patterns 6 which transmit signals having high levels of importance or such. The wiring patterns 6 having the high levels of importance can be selected by using the attributes of the wiring patterns 6 (for example, signal types (signal names) of signals transmitted by the wiring patterns 6).

Thus, it is possible to select a specific wiring pattern 6 and determine crosstalk intensity. Therefore, calculation need not be carried out for all the wiring patterns 6, and thus, it is possible to reduce the number of processes during a stage in which the wiring patterns are designed.

Further, it is possible to calculate crosstalk intensity in consideration of very small solid pattern removed areas (pattern removed areas) or such by using CAD data. Therefore, the wiring design assisting apparatus in the embodiment 2 can assist, especially in wiring design of a printed circuit board 5 that processes high-speed (high-rate) signals, so that a designer can carry out wiring design in which signal characteristics are satisfactory in consideration of very small pattern removed areas.

It is noted that it is possible to combine the wiring design assisting apparatus in the embodiment 1 and the wiring design assisting apparatus in the embodiment 2 together. That is, a wiring pattern 6 to be used in re-wiring may be extracted in consideration of both characteristic impedance degradation and influence of crosstalk.

Embodiment 3

According to the wiring design assisting apparatus in the embodiment 1 described above, the degradation degree calculating part 215 obtains a specific value of characteristic impedance. A wiring design assisting apparatus in an embodiment 3 is different from the above-described wiring design assisting apparatus in the embodiment 1 in that the degradation degree calculating part 215 determines a degradation degree in signal characteristics by using an area of a solid pattern removed area 8 existing from a start point to an end point of a wiring pattern 6. That is, according to the wiring design assisting apparatus in the embodiment 3, as a value representing a characteristic impedance degradation degree, an area of a solid pattern removed area 8 is used. The other configuration of the embodiment 3 is the same as that of the wiring design assisting apparatus in the embodiment 1, the same reference numerals are given to the same parts/components, and description thereof will be omitted. Further, FIG. 6 used above for describing the functions of the wiring design assisting apparatus in the embodiment 1 is also used to describe functions the wiring design assisting apparatus in the embodiment 3.

The degradation degree calculating part 215 in the embodiment 3 integrates the areas of the solid pattern removed area 8, calculated by the area calculating part 214, from the start point to the end point of the wiring pattern 6, and thus, obtains the area of the solid pattern removed area 8 existing from the start point to the end point of the wiring pattern 6 within the range in the width direction for which a characteristic impedance degradation degree is calculated. The degradation degree calculating part 215 in the embodiment 3 does not use the "increased coefficient" depicted in FIG. 12, which is used in the above-mentioned formula (2), and the "solid pattern removed area (mm$^2$) for the section" in the formula (2) is integrated from the start point to the end point of the wiring pattern 6, and determines a characteristic impedance degradation degree by using the value obtained from thus integrating the area (referred to as an integrated area value, or an area value of a solid pattern removed area, hereinafter).

The extracting process part 216 in the embodiment 3 extracts wiring patterns having the integrated area value equal to or more than a criterion value, from among the plural wiring patterns 6 for which the degradation degree calculating part 215 has thus obtained the areas of solid pattern removed areas 8.

The layer grading process part 217 in the embodiment 3 obtains a total amount of the areas of the wiring patterns 6 extracted by the extracting process part 216 for each of the dielectric layers, and grades the dielectric layers according to the total amounts.

The wiring grading process part 218 in the embodiment 3 grades the wiring patterns 6 according to the amounts of the areas, and creates data in which the wiring patterns 6 are sorted according to the areas of the solid pattern removed areas 8 in a descending order. The wiring pattern 6 determined as having the largest area by the grading is allocated by the allocating process part 219 in the embodiment 3 to the electric layer having the smallest total amount of the areas.

It is noted that, in the embodiment 3, instead of a shift of characteristic impedance being calculated in the embodiment 1, areas of solid pattern removed areas which cause degradation in signal characteristics are obtained, whereby a wiring pattern to be used in re-wiring is extracted.

However, to thus extract a wiring pattern for re-wiring by using areas of areas causing degradation in signal characteristics may also be applied to the embodiment 2. In a case of applying to the embodiment 2, a wiring pattern to be used in re-wiring may be extracted based on the calculated results of the areas of the crosstalk areas.

Thus, by the wiring design assisting apparatus in the embodiment 3, in the same way as in the embodiments 1 and 2, the areas of the solid pattern removed areas 8 or the areas of the crosstalk areas which cause degradation in signal characteristics are calculated by using the CAD data, and degradation degrees in signal characteristics are calculated based on the areas of the solid pattern removed areas 8 or the areas of the crosstalk areas. As a result, it is possible to identify wiring patterns 6 having large degradation degrees in signal characteristics, from among wiring patterns having high levels of importance included in a huge number of wiring patterns 6, by selecting wiring patterns 6 which transmit signals having high levels of importance or such. Further, it is possible to calculate degradation degrees in signal characteristics in consideration of very small solid pattern removed areas (pattern removed areas) or such. Therefore, it is possible to extract a wiring pattern having large influence on signal characteristics in consideration of a very small pattern removed area or such, in a stage in which a wiring structure is designed.

Thus, it is possible to assist in design of a wiring structure efficiently.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that various changes, substitutions, and alterations could be made hereto without departing from the sprit and scope of the invention.

What is claimed is:

1. A wiring design assisting apparatus that assists in wiring design of wiring patterns formed in a printed circuit board having plural layers, the wiring design assisting apparatus comprising:
   a first database that stores attribute information and position information that indicate attributes and positions of the wiring patterns in a manner in which the attribute information and the position information are associated with the wiring patterns;
   a second database that stores position information and size information that indicate positions and sizes of pattern removed areas that exist in solid patterns provided in the printed circuit board;
   a third database that stores degradation degree information that indicates degradation degrees in signal characteristics in the wiring patterns with respect to positional relationships between the wiring patterns and the pattern removed areas, and sizes of the pattern removed areas;
   an input part that has the attribute information of the wiring pattern input thereto;
   a degradation degree process part that obtains the degradation degree in the signal characteristics in the wiring pattern corresponding to the attribute information that is input to the input part, based on the position information of the wiring pattern corresponding to the attribute information input to the input part, the position information and the size information of the pattern removed area, and the degradation degree information; and
   an extracting process part that extracts, for re-wiring, the wiring pattern that has the degradation degree equal to or more than a predetermined degree, from the wiring patterns for which degradation degrees have been obtained by the degradation degree process part.

2. The wiring design assisting apparatus as claimed in claim 1, further comprising:
   an allocating process part that allocates the wiring pattern extracted by the extracting process part to a layer of the plural layers from another layer.

3. The wiring design assisting apparatus as claimed in claim 2, further comprising:
   an extraction degree process part that obtains an extraction degree that indicates a degree in which the extracting process part extracts the wiring patterns for each of the plural layers, wherein:
   the allocating process part allocates the wiring pattern that is included in the wiring patterns extracted by the extracting process part to the layer having an extraction degree lower than the extraction degree of the other layer on which the wiring is originally allocated.

4. The wiring design assisting apparatus as claimed in claim 3, further comprising:
   a grading processing part that grades the wiring patterns that are included in the wiring patterns extracted by the extracting process part and exist on the other layer having the extraction degree higher than the extraction degree of the layer, according to degradation degrees in signal characteristics obtained by the degradation degree processing part, wherein
   the allocating process part allocates the wiring pattern graded by the grading process part, with priority over the lower graded wiring pattern, to the layer having the extraction degree lower than the extraction degree of the other layer.

5. The wiring design assisting apparatus as claimed in claim 1, wherein:
the degradation degree process part obtains the degradation degree in signal characteristics of the wiring pattern by using area data of the pattern removed area, as the size information of the pattern removed area.

6. The wiring design assisting apparatus as claimed in claim 5, wherein:
the degradation degree process part obtains the degradation degree in signal characteristics in the wiring pattern by using, in a plan view manner, area data of the pattern removed area that is located within a predetermined range in a width direction with respect to the wiring pattern.

7. The wiring design assisting apparatus as claimed in claim 5, wherein:
the degradation degree process part divides the pattern removed area in predetermined area units, and obtains the degradation degree in signal characteristics in the wiring pattern for every predetermined area unit of the pattern removed area.

8. The wiring design assisting apparatus as claimed in claim 7, wherein:
the predetermined unit area is defined by a side, size of which is determined based on a fall time or a rise time of a signal transmitted through the wiring pattern, and a propagation velocity of the signal in the wiring pattern.

9. The wiring design assisting apparatus as claimed in claim 1, wherein:
the degradation degree in signal characteristics in the wiring pattern comprises a degradation degree in signal characteristics caused by a change in characteristic impedance of the wiring pattern or crosstalk occurring in the wiring pattern.

10. A wiring design assisting method in which a computer assists in wiring design of wiring patterns that are formed in a printed circuit board, the wiring design assisting method comprising:
using a first database that stores attribute information and position information that indicate attributes and positions of the wiring patterns in a manner in which the attribute information and the position information are associated with the wiring pasterns, a second database that stores position information and size information that indicate positions and sizes of pattern removed areas that exist in solid patterns provided in the printed circuit board, and a third database that stores degradation degree information that indicates degradation degrees in signal characteristics of the wiring patterns with respect to positional relationships between the wiring patterns and the pattern removed areas, and sizes of the pattern removed areas;
obtaining a degradation degree in the signal characteristics of the wiring pattern corresponding to the attribute information that is input to an input part, based on position information of the wiring pattern corresponding to the attribute information input to the input part, position information and size information of the pattern removed area, and the degradation degree information; and
extracting, for re-wiring, the wiring pattern that has the degradation degree equal to or more than a predetermined degree, from the wiring patterns for which degradation degrees have been obtained by the obtaining.

11. A computer-readable information recording medium embodying a wiring design assisting program which, when executed by a computer processor, performs a wiring design assisting method, the wiring design assisting method comprising:
using a first database that stores attribute information and position information that indicate attributes and positions of the wiring patterns in a manner in which the attribute information and the position information are associated with the wiring patterns, a second database that stores position information and size information that indicate positions and sizes of pattern removed areas that exist in solid patterns provided in the printed circuit board, and a third database that stores degradation degree information that indicates degradation degrees in signal characteristics of wiring patterns with respect to positional relationships between the wiring patterns and the pattern removed areas, and sizes of the pattern removed areas;
obtaining a degradation degree in the signal characteristics of the wiring pattern corresponding to the attribute information that is input to an input part, based on position information of the wiring pattern corresponding to the attribute information input to the input part, position information and size information of the pattern removed area, and the degradation degree information; and
extracting, for re-wiring, the wiring pattern that has the degradation degree equal to or more than a predetermined degree, from the wiring patterns for which degradation degrees have been obtained by the obtaining.

* * * * *